(12) United States Patent
Kwak

(10) Patent No.: US 11,917,847 B2
(45) Date of Patent: Feb. 27, 2024

(54) ELECTROLUMINESCENT DISPLAY DEVICE INCLUDING A CONDUCTIVE BANK DISPOSED BETWEEN A SECOND ELECTRODE AND A CONNECTION PATTERN

(71) Applicant: LG DISPLAY CO., LTD., Seoul (KR)

(72) Inventor: Jin-Ah Kwak, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 166 days.

(21) Appl. No.: 17/521,114

(22) Filed: Nov. 8, 2021

(65) Prior Publication Data
US 2022/0173352 A1 Jun. 2, 2022

(30) Foreign Application Priority Data
Nov. 30, 2020 (KR) ........................ 10-2020-0164875

(51) Int. Cl.
*H01L 29/08* (2006.01)
*H10K 50/824* (2023.01)
*H10K 59/122* (2023.01)
*H10K 59/126* (2023.01)
(52) U.S. Cl.
CPC ......... *H10K 50/824* (2023.02); *H10K 59/122* (2023.02); *H10K 59/126* (2023.02)

(58) Field of Classification Search
CPC ... H10K 58/122; H10K 59/126; H10K 50/824
USPC .......................................................... 257/40
See application file for complete search history.

(56) References Cited

U.S. PATENT DOCUMENTS

2019/0288046 A1* 9/2019 Park .................... H10K 59/131

FOREIGN PATENT DOCUMENTS

KR 20180047588 A * 5/2018 ........... H10K 59/131

* cited by examiner

*Primary Examiner* — Phuc T Dang
(74) *Attorney, Agent, or Firm* — POLSINELLI PC

(57) ABSTRACT

An electroluminescent display device includes a substrate, a first electrode on the substrate, a connection pattern on the substrate and formed of a same material as the first electrode, a bank covering edges of the first electrode and the connection pattern and including a hydrophobic bank, a light-emitting layer on the first electrode, a second electrode on the light-emitting layer, the bank, and the connection pattern, and a conductive bank between the second electrode and the connection pattern, wherein the second electrode is in contact with a side surface of the conductive bank.

20 Claims, 15 Drawing Sheets

ELECTROLUMINESCENT DISPLAY DEVICE INCLUDING A CONDUCTIVE BANK DISPOSED BETWEEN A SECOND ELECTRODE AND A CONNECTION PATTERN

CROSS-REFERENCE TO RELATED APPLICATION

The present application claims priority from and the benefit under 35 U.S.C § 119(a) of Korea Patent Application No. 10-2020-0164875 filed on Nov. 30, 2020, which is hereby incorporated by reference in its entirety.

BACKGROUND

Field of the Disclosure

The present disclosure relates to an electroluminescent display device, and more particularly, to an electroluminescent display device that can be implemented for a large size with a high definition.

Description of the Background

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response time. Further, the electroluminescent display device is strong against the external impacts and is used in a wide range of temperatures because its components are solids, and particularly, the electroluminescent display device can be manufactured at low costs.

The electroluminescent display device includes a plurality of pixels, each of which has red, green, and blue sub-pixels, and displays various color images by allowing the red, green, and blue sub-pixels to selectively emit light.

The red, green and blue sub-pixels have red, green and blue light-emitting layers, respectively, and each light-emitting layer is formed through a vacuum thermal evaporation process in which a luminous material is selectively deposited using a fine metal mask (FMM).

However, the evaporation process increases manufacturing costs due to preparation of the mask and has a problem in application to a large-sized and high-definition display device due to manufacturing variations, sagging, shadow effect of the mask, and the like.

SUMMARY

Accordingly, the present disclosure is directed to an electroluminescent display device that substantially obviates one or more of the problems due to limitations and disadvantages of the related art.

More specifically, the present disclosure is to provide an electroluminescent display device that can be implemented for a large size with a high definition.

Additional features and advantages of the present disclosure will be set forth in the description which follows, and in part will be apparent from the description, or can be learned by practice of the present disclosure. Other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device that includes a substrate, a first electrode on the substrate, a connection pattern on the substrate and formed of a same material as the first electrode, a bank covering edges of the first electrode and the connection pattern and including a hydrophobic bank, a light-emitting layer on the first electrode, a second electrode on the light-emitting layer, the bank, and the connection pattern, and a conductive bank between the second electrode and the connection pattern, wherein the second electrode is in contact with a side surface of the conductive bank.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of the disclosure, illustrate an aspect of the present disclosure and together with the description serve to explain the principles of the present disclosure.

In the drawings.

DETAILED DESCRIPTION

Reference will now be made in detail to exemplary aspects of the disclosure, examples of which are illustrated in the accompanying drawings.

An electroluminescent display device according to an aspect of the present disclosure includes a plurality of pixels to display an image, and each of the plurality of pixels includes red, green, and blue sub-pixels. A pixel region corresponding to each sub-pixel can have a configuration shown in FIG. 1.

Figure 1:
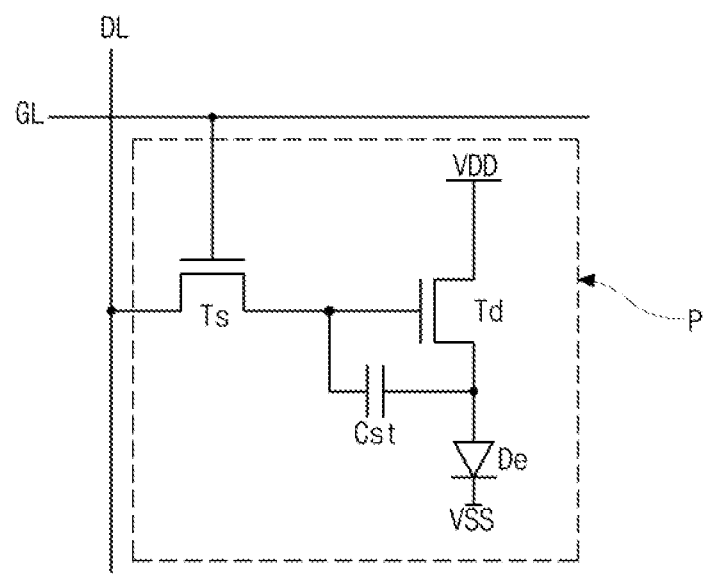
FIG. 1 is a circuit diagram of one pixel region of an electroluminescent display device according to an aspect of the present disclosure.

FIG. 1 is a circuit diagram of one pixel region of an electroluminescent display device according to an aspect of the present disclosure.

In FIG. 1, the electroluminescent display device according to the aspect of the present disclosure includes a plurality of gate lines and a plurality of data lines crossing each other to define a plurality of pixel regions. Particularly, in the example of FIG. 1, a gate line GL and a data line DL cross each other to define a pixel region P. A switching thin film transistor Ts, a driving thin film transistor Td, a storage capacitor Cst, and a light-emitting diode De are formed in each pixel region P.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high voltage supply VDD. An anode of the light-emitting diode De is connected to a drain electrode of the driving thin film transistor Td, and a cathode of the light-emitting diode De is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De is controlled, thereby displaying an image. The light-emitting diode De emits light due to the current supplied through the driving thin film transistor Td from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in the pixel region P in addition to the switching and driving thin film transistors Ts and Td and the storage capacitor Cst.

For example, in the electroluminescent display device, the driving thin film transistor Td is turned on for a relatively long time while the data signal is applied to the gate electrode of the driving thin film transistor Td and the light-emitting diode De emits light to thereby display the gray level. The driving thin film transistor Td can deteriorate due to application of the data signal for a long time. Therefore, the mobility and/or threshold voltage Vth of the driving thin film transistor Td are changed, and thus the pixel region P of the electroluminescent display device displays a different gray level with respect to the same data signal. This causes non-uniform luminance, thereby lowering the image quality of the electroluminescent display device.

Accordingly, to compensate the change of the mobility and/or threshold voltage of the driving thin film transistor Td, at least one sensing thin film transistor and/or capacitor for sensing a voltage change can be further added in the pixel region P. The sensing thin film transistor and/or capacitor can be connected to a reference line for applying a reference voltage and outputting a sensing voltage.

In the electroluminescent display device according to the aspect of the present disclosure, the light-emitting diode De includes a first electrode, a light-emitting layer, and a second electrode. The first electrode, the light-emitting layer, and the second electrode can be sequentially formed over a substrate, and the switching thin film transistor Ts, the driving thin film transistor Td, and the storage capacitor Cst can be formed between the substrate and the first electrode. The electroluminescent display device according to the aspect of the present disclosure can be a top emission type in which light from the light-emitting layer of the light-emitting diode De is output toward a direction opposite the substrate, that is, output to the outside through the second electrode. The top emission type display device can have a wider emission area than a bottom emission type display device of the same size, to thereby improve luminance and reduce power consumption.

To transmit light, the second electrode should be formed of a metal material so as to have a thin thickness or formed of a transparent conductive material. According to this, the resistance of the second electrode can increase, and a voltage drop can occur due to the resistance, thereby causing a problem of non-uniform brightness.

Therefore, in the present disclosure, the second electrode is electrically connected to an auxiliary electrode in order to decrease the resistance of the second electrode. At this time, the second electrode can be electrically connected to the auxiliary electrode through a connection pattern, and a conductive bank can be formed between the connection pattern and the second electrode, so that the electrical contact property can be improved by decreasing the contact resistance between the connection pattern and the second electrode.

Figure 2:
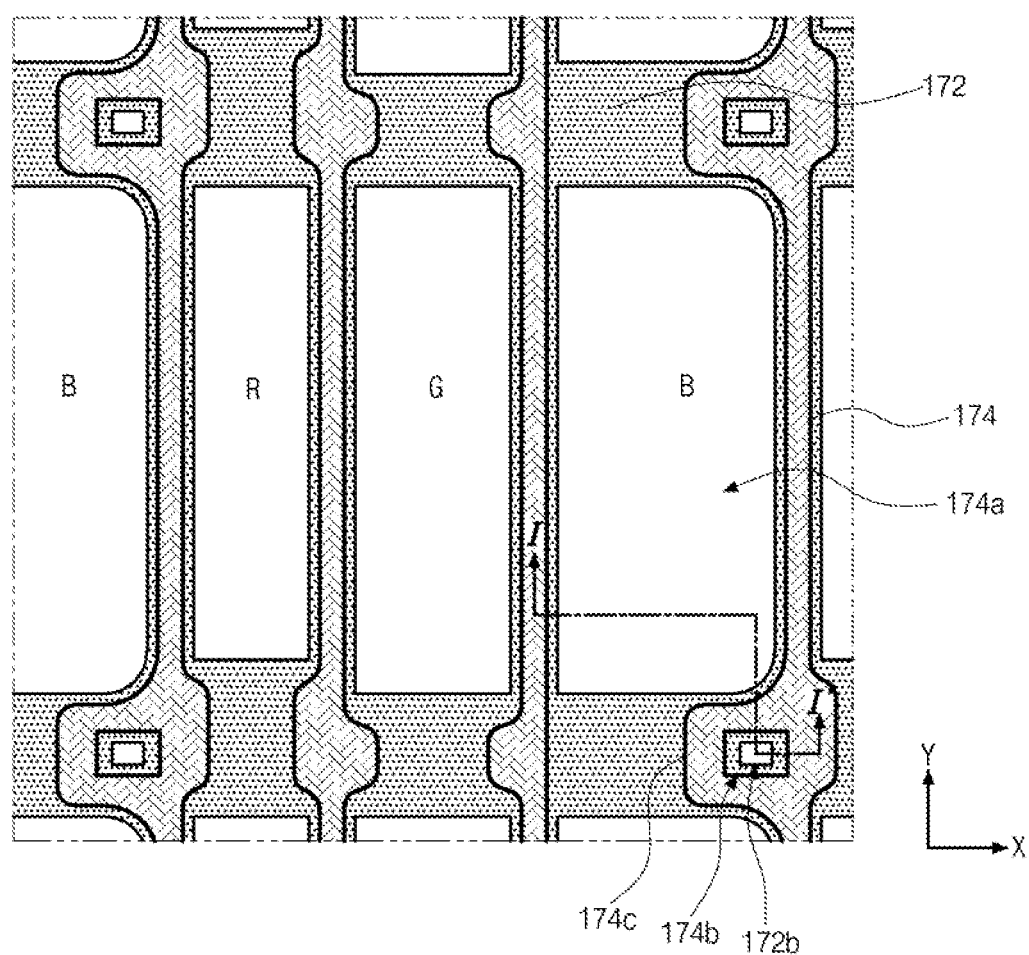
FIG. 2 is a schematic plan view of an electroluminescent display device according to an aspect of the present disclosure.

FIG. 2 is a schematic plan view of an electroluminescent display device according to an aspect of the present disclosure and mainly shows a bank configuration.

As shown in FIG. 2, one pixel of the electroluminescent display device according to the aspect of the present disclosure includes red, green, and blue sub-pixels R, G, and B. Each of the red, green, and blue sub-pixels R, G, and B can have the circuit configuration of the pixel region P of FIG. 1.

The red, green, and blue sub-pixels R, G, and B are sequentially arranged along a first direction (X direction), which is a horizontal direction in the context of the figure, and the same color sub-pixels R, G, and B are arranged along a second direction (Y direction), which is perpendicular to the first direction (X direction). Here, the red, green, and blue sub-pixels R, G, and B are shown to each have a rectangular shape with substantially angled corners, but is not limited thereto. Each of the red, green, and blue sub-pixels R, G, and B can have various shapes such as a rectangular shape with rounded corners, an oval shape, or the like.

The red, green, and blue sub-pixels R, G, and B can have different sizes. The sizes of the red, green, and blue sub-pixels R, G, and B are determined by considering the lifetime of a light-emitting diode provided at each sub-pixel. For example, the size of the green sub-pixel G can be larger than the size of the red sub-pixel R and smaller than the size of the blue sub-pixel B. However, the present disclosure is not limited thereto. Alternatively, the red, green, and blue sub-pixels R, G, and B can have the same size.

The red, green, and blue sub-pixels R, G, and B can be defined by a bank. The bank includes a first bank 172 of a hydrophilic property and a second bank 174 of a hydrophobic property.

More specifically, the first bank 172 is disposed between adjacent same color sub-pixels R, G, and B and between adjacent different color sub-pixels R, G, and B. The first bank 172 can surround each of the sub-pixels R, G, and B.

Alternatively, the first bank 172 can be omitted between the adjacent different color sub-pixels R, G, and B. That is, the first bank 172 can extend along the first direction (X direction) and can be formed only between the adjacent same color sub-pixels R, G and B along the second direction (Y direction).

The second bank 174 is disposed on the first bank 172. The second bank 174 has an opening 174a corresponding to a same color sub-pixel column and is disposed between adjacent different color sub-pixels R, G and B along the first direction (X direction).

Accordingly, the opening 174a extends in the second direction (Y direction), and the opening 174a has a length of the second direction (Y direction) longer than a length of the first direction (X direction), that is, a width. The opening 174a has a short side parallel to the first direction (X direction) and a long side parallel to the second direction (Y direction). At this time, the second bank 174 can have a narrower width than the first bank 172 between the adjacent different color sub-pixels R, G and B along the first direction (X direction).

In addition, the second bank 174 can have an extension part 174c extending in the first direction (X direction). For example, the extension part 174c can be disposed between the adjacent same color sub-pixels R, G, and B along the second direction (Y direction) and can overlap the first bank 172. The extension part 174c narrows a distance between adjacent portions of the second bank 174 along the first direction (X direction), so that the flow of solution is controlled during a solution process for formation of a light-emitting layer, thereby more uniformly forming the light-emitting layer.

The size of the extension part 174c can depend on the size of each sub-pixel R, G, and B.

Meanwhile, the first bank 172 and the second bank 174 can have first and second auxiliary contact holes 172b and 174b corresponding to at least one extension part 174c, respectively.

Here, one first and second auxiliary contact holes 172b and 174b can be formed to correspond to one pixel including the red, green, and blue sub-pixels R, G, and B. At this time, the first and second auxiliary contact holes 172b and 174b can be formed to be adjacent to the largest one of the sub-pixels R, G, and B. For example, the first and second auxiliary contact holes 172b and 174b can be formed to correspond to the extension part 174c, which is disposed between adjacent blue sub-pixels B along the second direction (Y direction). However, the present disclosure is not limited thereto, and the number and location of the first and second auxiliary contact holes 172b and 174b can be varied.

Although not shown in the figure, an auxiliary electrode and a connection pattern are formed to correspond to the extension part 174c where the first and second auxiliary contact holes 172b and 174b are formed, and the connection pattern is exposed through the first and second auxiliary contact holes 172b and 174b. In addition, a conductive bank is formed between the connection pattern and the second electrode. Accordingly, the second electrode of the light-emitting diode is electrically connected to the auxiliary electrode through the connection pattern, and it is possible to decrease the contact resistance between the connection pattern and the second electrode due to the conductive bank.

Specific configurations of the electroluminescent display device according to the aspect of the present disclosure will be described in detail with reference to drawings.

—First Aspect—

Figure 3:
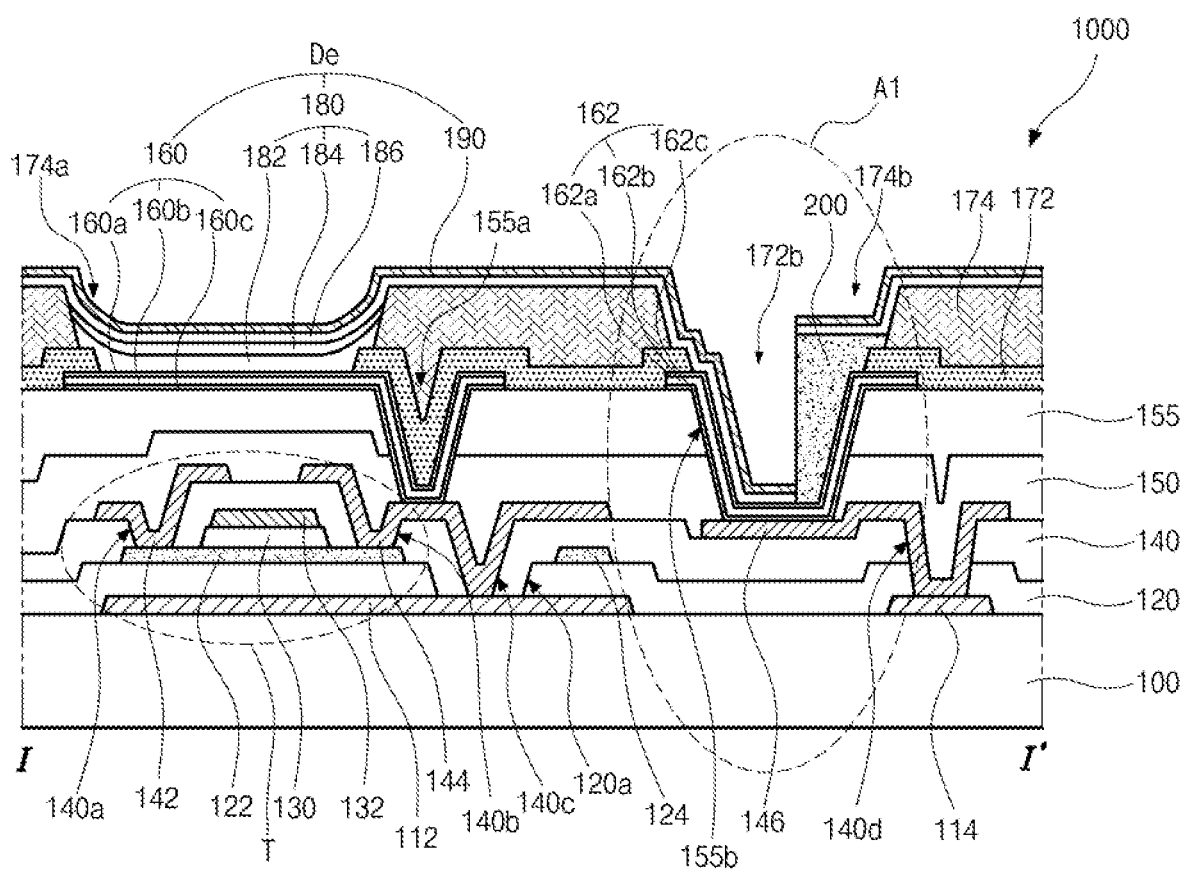
FIG. 3 is a schematic cross-sectional view of an electroluminescent display device according to a first aspect of the present disclosure.

FIG. 3 is a schematic cross-sectional view of an electroluminescent display device according to a first aspect of the present disclosure and shows a cross-section corresponding to the line I-I' of FIG. 2.

As shown in FIG. 3, in the electroluminescent display device 1000 according to the first aspect of the present disclosure, a light-blocking pattern 112 and a first auxiliary electrode 114 of a first conductive material such as metal are formed on a substrate 100. The substrate 100 can be a glass substrate or a plastic substrate. For example, polyimide can be used for the plastic substrate, but is not limited thereto.

The light-blocking pattern 112 and the first auxiliary electrode 114 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the light-blocking pattern 112 and the first auxiliary electrode 114 can have a double-layered structure including a lower layer of a molybdenum-titanium alloy (MoTi) and an upper layer of copper (Cu), and the upper layer can have a thicker thickness than the lower layer.

The first auxiliary electrode 114 can extend in a first direction (X direction) and/or a second direction (Y direction) parallel to the substrate 100 in a plane. For example, the first auxiliary electrode 114 can extend in the first direction (X direction) and correspond to a plurality of pixel regions arranged along the first direction (X direction). Otherwise, the first auxiliary electrode 114 can extend in the second direction (Y direction) crossing the first direction (X direction) and correspond to a plurality of pixel regions arranged along the second direction (Y direction). Alternatively, the first auxiliary electrode 114 can extend in the first and second directions (X and Y directions) and have a lattice structure. However, the present disclosure is not limited thereto.

A buffer layer 120 is formed on the light-blocking pattern 112 and the first auxiliary electrode 114 substantially on an entire surface of the substrate 100. The buffer layer 120 can be formed of an inorganic insulating material such as silicon oxide (SiO$_2$) or silicon nitride (SiNx) and can be formed as a single layer or multi layers.

Here, the buffer layer 120 has a buffer hole 120a on the light-blocking pattern 112, and a top surface of the light-blocking pattern 112 is partially exposed through the buffer hole 120a.

A semiconductor layer 122 and a capacitor electrode 124 are patterned and formed on the buffer layer 120. The semiconductor layer 122 and the capacitor electrode 124 are spaced apart from each other over the light-blocking pattern 112. The light-blocking pattern 112 blocks light incident on the semiconductor layer 122 and prevents the semiconductor layer 122 from deteriorating due to the light.

The semiconductor layer 122 and the capacitor electrode 124 can be formed of polycrystalline silicon, and in this case, the capacitor electrode 124 and both ends of the semiconductor layer 122 can be doped with impurities. Alternatively, the semiconductor layer 122 and the capacitor electrode 124 can be formed of an oxide semiconductor material.

A gate insulation layer 130 of an insulating material and a gate electrode 132 of a second conductive material are sequentially formed on the semiconductor layer 122. The gate insulation layer 130 and the gate electrode 132 are disposed to correspond to a center of the semiconductor layer 122.

The gate insulation layer 130 can be formed of an inorganic insulating material such as silicon oxide (SiO$_2$) or silicon nitride (SiNx). When the semiconductor layer 122 is made of an oxide semiconductor material, the gate insulation layer 130 may be formed of silicon oxide (SiO$_2$).

Alternatively, when the semiconductor layer 122 is made of polycrystalline silicon, the gate insulation layer 130 can be formed of silicon oxide (SiO$_2$) or silicon nitride (SiNx).

The gate electrode 132 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the gate electrode 132 can have a double-layered structure including a lower layer of a molybdenum-titanium alloy (MoTi) and an upper layer of copper (Cu), and the upper layer can have a thicker thickness than the lower layer.

As shown in the figure, the gate insulation layer 130 can be patterned to have the same shape as the gate electrode 132. At this time, a width of the gate insulation layer 130 can be greater than a width of the gate electrode 132, and thus, edges of a top surface of the gate insulation layer 130 can be exposed. Alternatively, the width of the gate insulation layer 130 can be the same as the width of the gate electrode 132.

Otherwise, the gate insulation layer 130 may not be patterned and can be formed substantially over the entire surface of the substrate 100.

Meanwhile, a gate line (not shown) can be further formed of the same material and on the same layer as the gate electrode 132. The gate line can extend in the first direction (X direction). When the first auxiliary electrode 114 extend in the first direction (X direction), the gate line and the first auxiliary electrode 114 can be parallel to each other.

An interlayer insulation layer 140 made of an insulating material is formed on the gate electrode 132 substantially over the entire surface of the substrate 100. The interlayer insulation layer 140 can be formed of an inorganic insulating material such as silicon oxide (SiO$_2$) or silicon nitride (SiNx). Alternatively, the interlayer insulation layer 140 can be formed of an organic insulating material such as photo acryl or benzocyclobutene.

The interlayer insulation layer 140 has first, second, third and fourth contact holes 140a, 140b, 140c and 140d. The first and second contact holes 140a and 140b expose the both ends of the semiconductor layer 122. The third contact hole 140c partially exposes the top surface of the light-blocking pattern 112 and is located in the buffer hole 120a. Alternatively, the buffer hole 120a may be omitted, and the third contact hole 140c can be formed in the buffer layer 120 as well as in the interlayer insulation layer 140 to partially expose the top surface of the light-blocking pattern 112. The fourth contact hole 140d is formed in the buffer layer 120 as well as in the interlayer insulation layer 140 to partially expose a top surface of the first auxiliary electrode 114.

Source and drain electrodes 142 and 144 and a second auxiliary electrode 146 made of a third conductive material such as metal are formed on the interlayer insulation layer 140. The source and drain electrodes 142 and 144 and the second auxiliary electrode 146 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the source and drain electrodes 142 and 144 and the second auxiliary electrode 146 can have a double-layered structure including a lower layer of a molybdenum-titanium alloy (MoTi) and an upper layer of copper (Cu), and the upper layer can have a thicker thickness than the lower layer. Alternatively, the source and drain electrodes 142 and 144 and the second auxiliary electrode 146 can have a triple-layered structure.

The source and drain electrodes 142 and 144 are spaced apart from each other substantially with the gate electrode 132 positioned therebetween. The source and drain electrodes 142 and 144 contact the both ends of the semiconductor layer 122 through the first and second contact holes 140a and 140b, respectively. Further, the drain electrode 144 contacts the light-blocking pattern 112 through the third contact hole 140c and overlaps the capacitor electrode 124. The capacitor electrode 124 overlaps the light-blocking pattern 112 and the drain electrode 144 to form a storage capacitor.

Meanwhile, the second auxiliary electrode 146 overlaps and contacts the first auxiliary electrode 114 through the fourth contact hole 140d. The second auxiliary electrode 146 can extend in the second direction (Y direction) and correspond to the plurality of pixel regions arranged along the second direction (Y direction). However, the present disclosure is not limited thereto.

In addition, a data line (not shown) and a high voltage supply line (not shown) can be further formed on the interlayer insulation layer 140 and can be made of the third conductive material. The data line and the high voltage supply line can extend in the second direction (Y direction). Accordingly, the data line, the high voltage supply line, and the second auxiliary electrode 146 can be parallel to each other.

The semiconductor layer 122, the gate electrode 132, and the source and drain electrodes 142 and 144 form a thin film transistor T. The thin film transistor T has a coplanar structure in which the gate electrode 132 and the source and drain electrodes 142 and 144 are located at the same side with respect to the semiconductor layer 122.

Alternatively, the thin film transistor T can have an inverted staggered structure in which the gate electrode and the source and drain electrodes are located at different sides with respect to the semiconductor layer. That is, the gate electrode can be disposed under the semiconductor layer, and the source and drain electrodes can be disposed over the semiconductor layer. In this case, the semiconductor layer can be formed of oxide semiconductor or amorphous silicon.

The thin film transistor T corresponds to a driving thin film transistor Td of FIG. 1, and a switching thin film transistor Ts of FIG. 1 having the same structure as the driving thin film transistor T can be further formed on the substrate 100. The gate electrode 132 of the driving thin film transistor can be connected to a drain electrode of the switching thin film transistor, and the source electrode 142 of the driving thin film transistor is connected to the power supply line. In addition, a gate electrode and a source electrode of the switching thin film transistor can be connected to the gate line and the data line, respectively.

A passivation layer 150 of an insulating material is formed on the source and drain electrodes 142 and 144 and the second auxiliary electrode 146 substantially over the entire surface of the substrate 100. The passivation layer 150 can be formed of an inorganic insulating material such as silicon oxide ($SiO_2$) or silicon nitride (SiNx).

Next, an overcoat layer 155 of an insulating material is formed on the passivation layer 150 substantially over the entire surface of the substrate 100. The overcoat layer 155 can be formed of an organic insulating material such as photo acryl or benzocyclobutene. The overcoat layer 155 can eliminate level differences due to lower layers and have a substantially flat top surface.

Here, one of the passivation layer 150 and the overcoat layer 155 can be omitted. For example, the passivation layer 150 can be omitted, but is not limited thereto.

The passivation layer 150 and the overcoat layer 155 have a drain contact hole 155a exposing the drain electrode 144. Further, the passivation layer 150 and the overcoat layer 155 have a fifth contact hole 155b exposing the second auxiliary electrode 146.

A first electrode 160 having relatively high work function is formed on the overcoat layer 155. The first electrode 160 is in contact with the drain electrode 144 through the drain contact hole 155a.

The first electrode 160 includes a first layer 160a and a second layer 160b, and the second layer 160b is disposed between the first layer 160a and the substrate 100, more particularly, between the first layer 160a and the overcoat layer 155.

The first layer 160a is formed of a conductive material having relatively high work function. For example, the first layer 160a can be formed of a transparent conductive material such as indium tin oxide (ITO) or indium zinc oxide (IZO). The second layer 160b is formed of a metal material having relatively high reflectance. For example, the second layer 160b can be formed of silver (Ag). Here, the work function of the first layer 160a is higher than the work function of the second layer 160b.

A thickness of the second layer 160b can be greater than a thickness of the first layer 160a. For example, the thickness of the second layer 160b can be 80 nm to 100 nm, and the thickness of the first layer 160a can be 10 nm to 80 nm. However, the present disclosure is not limited thereto.

In addition, the first electrode 160 can further include a third layer 160c between the second layer 160b and the overcoat layer 155. The third layer 160c is formed to improve the adhesion property between the second layer 160b and the overcoat layer 155, and the third layer 160c can be omitted. For example, the third layer 160c can be formed of a transparent conductive material such as ITO or IZO, but is not limited thereto.

A thickness of the third layer 160c can be smaller than the thickness of the first layer 160a and can be smaller than or equal to the thickness of the second layer 160b. For example, the thickness of the third layer 160c can be 10 nm, but is not limited thereto.

In addition, a connection pattern 162 is formed on the overcoat layer 155 and is formed of the same material as the first electrode 160. Accordingly, the connection pattern 162 can include first, second, and third layers 162a, 162b, and 162c. At this time, the second layer 162b is disposed between the first layer 162a and the third layer 162c, and the third layer 162c is disposed between the second layer 162b and the substrate 100, more particularly, between the second layer 162b and the overcoat layer 155. The connection pattern 162 is in contact with the second auxiliary electrode 146 through the fifth contact hole 155b.

Meanwhile, as described above, when the third layer 160c of the first electrode 160 is omitted and the first electrode 160 is configured as double layers, the third layer 162c of the connection pattern 162 is also omitted and the connection pattern 162 has a double-layered structure.

A bank of an insulating material is formed on the first electrode 160. The bank includes a first bank 172 of a hydrophilic property and a second bank 174 of a hydrophobic property.

More particularly, the first bank 172 overlaps and covers edges of the first electrode 160 and exposes a central portion of the first electrode 160. The first bank 172 is in contact with the edges of the first electrode 160. The first bank 172 is also formed on the connection pattern 162 and overlaps and covers edges of the connection pattern 162. The first bank 172 has a first auxiliary contact hole 172b exposing a central portion of the connection pattern 162.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

The second bank 174 is formed on the first bank 172. At this time, at least a top surface of the second bank 174 is hydrophobic, and a side surface of the second bank 174 can be hydrophobic or hydrophilic.

The second bank 174 has an opening 174a exposing the central portion of the first electrode 160. As described above, the second bank 174 can be formed between adjacent different color sub-pixels, and the opening 174a of the second bank 174 can be formed to correspond to the same color sub-pixel column.

The second bank 174 is disposed on the first bank 172 with a narrower width than the first bank 172 and exposes edges of the first bank 172. In addition, a thickness of the second bank 174 can be greater than a thickness of the first bank 172.

As described above, the first bank 172 can be omitted between the adjacent same different sub-pixels, and in this case, the second bank 174 can be in contact with the edges of the first electrode 160.

The second bank 174 can be formed of an organic insulating material having a hydrophobic property. Alternatively, the second bank 174 can be formed of an organic insulating material having a hydrophilic property and subjected to a hydrophobic treatment.

Further, the second bank 174 has a second auxiliary contact hole 174b corresponding to the first auxiliary contact hole 172b. The connection pattern 162 is exposed through the first and second auxiliary contact holes 172b and 174b.

Meanwhile, only the first bank 172 can be disposed on other edges of the first electrode 160 not shown in the figure.

In addition, the first bank 172 and the second bank 174 are formed of different materials and separated from each other in FIG. 3. However, the hydrophilic first bank 172 and the hydrophobic second bank 174 can be formed of the same material and formed as one body. For example, an organic material layer having a hydrophobic top surface can be formed substantially over the entire surface of the substrate 100, can be exposed to light through a halftone mask including a light-transmitting portion, a light-blocking portion and a half light-transmitting portion, and can be patterned, thereby forming the hydrophilic first bank 172 and the hydrophobic second bank 174 having different widths and different thicknesses.

Further, a conductive bank 200 is formed on at least one side surface of the first and second banks 172 and 174 corresponding to the first and second auxiliary contact holes 172b and 174b and is in contact with the connection pattern 162. This will be described in detail later.

A light-emitting layer 180 is formed on the first electrode 160 exposed by the first and second banks 172 and 174. The light-emitting layer 180 can include a first charge auxiliary layer 182, a light-emitting material layer 184, and a second charge auxiliary layer 186 that are sequentially positioned over the first electrode 160. The light-emitting material layer 184 can be formed of any one of red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer 182 can be a hole auxiliary layer, and the hole auxiliary layer can include at least one of a hole injecting layer (HIL) and a hole transporting layer (HTL). In addition, the second charge auxiliary layer 186 can be an electron auxiliary layer, and the electron auxiliary layer can include at least one of an electron injecting layer (EIL) and an electron transporting layer (ETL). However, the present disclosure is not limited thereto.

Here, each of the first charge auxiliary layer 182 and the light-emitting material layer 184 can be formed through a solution process. Thus, the process can be simplified and a display device with a large size and high resolution can be provided. A spin coating method, an ink jet printing method, or a screen printing method can be used as the solution process, but the present disclosure is not limited thereto.

As described above, since the opening 174a of the second bank 174 is formed to correspond to the same color sub-pixel column, solutions dropped into respective pixel regions corresponding to the same color sub-pixel column through different nozzles are connected to each other, and each of the first charge auxiliary layer 182 and the light-emitting material layer 184 is formed by drying the solutions. Thus, the first charge auxiliary layers 182 or the light-emitting material layers 184 in adjacent pixel regions corresponding to the same color sub-pixel column are connected to each other and formed as one body. Accordingly, the deviation between the dropping amounts of the nozzles can be minimized, and the thicknesses of the thin films formed in the respective pixel regions can be uniform.

When the solution is dried, a drying speed of a solvent in a region adjacent to the second bank 174 is different from that in other regions. That is, the drying speed of the solvent in the region adjacent to the second bank 174 is faster than that in the other regions. Therefore, a height of each of the first charge auxiliary layer 182 and the light-emitting material layer 184 in the region adjacent to the second bank 174 can rise as it gets closer to the second bank 174.

On the other hand, the second charge auxiliary layer 186 can formed through a thermal evaporation process. Accordingly, the second charge auxiliary layer 186 can be formed substantially over the entire surface of the substrate 100. That is, the second charge auxiliary layer 186 can be formed on the top surface and the side surface of the second bank 174 and can also be formed on the connection pattern 162.

A second electrode 190 of a conductive material having relatively low work function is formed on the light-emitting layer 180, specifically, on the second charge auxiliary layer 186 substantially over the entire surface of the substrate 100. The second electrode 190 can be formed of aluminum (Al), magnesium (Mg), silver (Ag), or an alloy thereof. At this time, the second electrode 190 has a relatively thin thickness such that light from the light-emitting layer 180 can be transmitted therethrough. For example, the second electrode 190 can have the thickness of 5 nm to 10 nm, but is not limited thereto.

Alternatively, the second electrode 190 can be formed of a transparent conductive material such as indium-gallium-oxide (IGO) or IZO.

The first electrode 160, the light-emitting layer 180, and the second electrode 190 constitute a light-emitting diode De. The first electrode 160 can serve as an anode, and the second electrode 190 can serve as a cathode, but is not limited thereto.

At this time, the light-emitting diode De of each pixel region can have an element thickness for a micro-cavity effect corresponding to a wavelength of the emitted light, thereby increasing the light efficiency. Here, the element thickness can be a distance between the first electrode 160 and the second electrode 190.

Meanwhile, although not shown in the figure, a capping layer can be formed on the second electrode 190 substantially over the entire surface of the substrate 100. The capping layer can be formed of an insulating material having a relatively high refractive index. The wavelength of light traveling along the capping layer can be amplified by surface plasma resonance, and thus the intensity of the peak can be increased, thereby improving the light efficiency in the top emission type electroluminescent display device. For example, the capping layer can be formed as a single layer of an organic layer or an inorganic layer or formed as organic/inorganic stacked layers.

As described above, the electroluminescent display device 1000 according to the first aspect of the present disclosure can be a top emission type in which light from the light-emitting layer 180 of the light-emitting diode De is output toward a direction opposite the substrate 100, that is, output to the outside through the second electrode 190. The top emission type display device can have a wider emission area than a bottom emission type display device of the same size, to thereby improve luminance and reduce power consumption.

To transmit light, the second electrode 190 is formed of a metal material so as to have a thin thickness or formed of a transparent conductive material, so that the resistance of the second electrode 190 increases. Accordingly, to lower the resistance of the second electrode 190, the second electrode 190 of the present disclose is electrically connected to the connection pattern 162 through the first and second auxiliary contact holes 172b and 174b. Therefore, the second electrode 190 is electrically connected to the first and second auxiliary electrodes 114 and 146 through the connection pattern 162. Here, one of the first and second auxiliary electrodes 114 and 146 can be omitted.

At this time, the second charge auxiliary layer 186 is disposed between the second electrode 190 and the connection pattern 162. Since the second charge auxiliary layer 186 has an insulating property and acts as a resistor, a contact property between the second electrode 190 and the connection pattern 162 is lowered. In addition, resistances acting on the first and second auxiliary contact holes 172b and 174b of respective pixel regions are not the same, thereby causing an emission difference between the pixel regions. Further, when the first electrode 160 and the connection pattern 162 include silver (Ag), there is a problem that the silver (Ag) flows out due to the high resistance between the second electrode 190 and the connection pattern 162.

However, in the present discloser, since the conductive bank 200 is formed on at least one side surface of the first and second banks 172 and 174 corresponding to the first and second auxiliary contact holes 172b and 174b, the conductive bank 200 is in direct contact with the connection pattern 162 and the second electrode 190, so that the contact property between the second electrode 190 and the connection pattern 162 can increase and the emission of each pixel region can be uniform.

This will be described in more detail with reference to FIG. 4.

Figure 4:
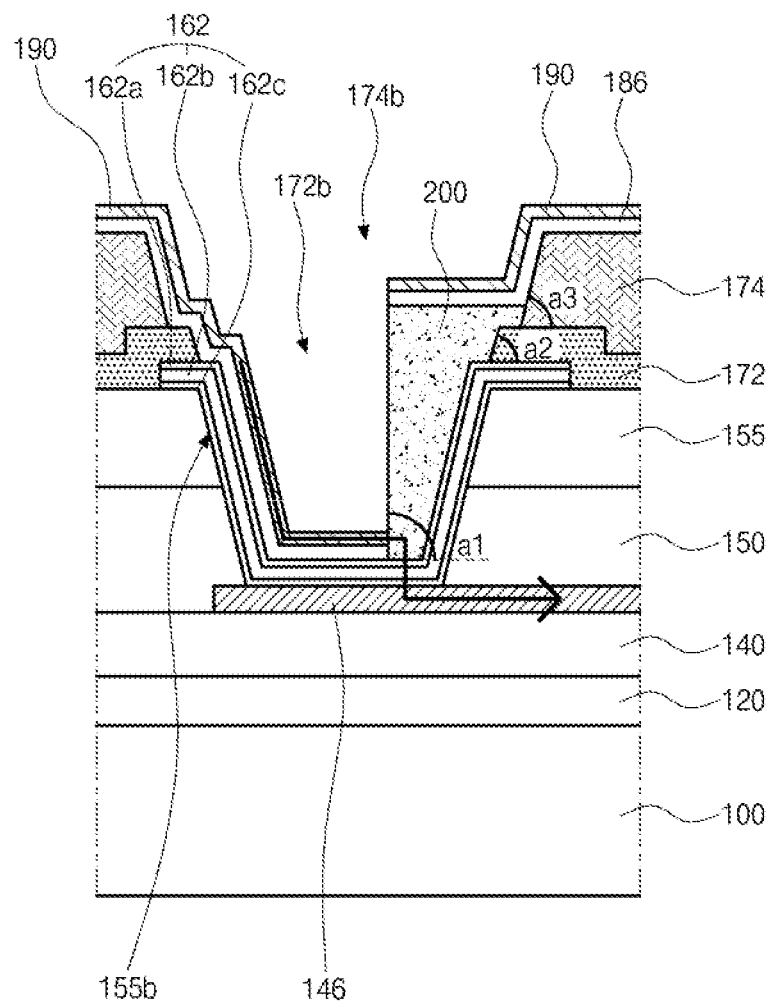
FIG. 4 is a schematic cross-sectional view enlarging area A1 of FIG. 3.

FIG. 4 is a schematic cross-sectional view enlarging the area A1 of FIG. 3 and shows a connection structure of a second electrode and an auxiliary electrode.

In FIG. 4, the connection pattern 162 is exposed through the first and second auxiliary contact holes 172b and 174b of the first and second banks 172 and 174, the second charge auxiliary layer 186 is formed between the connection pattern 162 and the second electrode 190, and the conductive bank 200 is formed between the connection pattern 162 and the second charge auxiliary layer 186.

More particularly, the first bank 172 having the first auxiliary contact hole 172b and the second bank 174 having the second auxiliary contact hole 174b are sequentially formed on the connection pattern 162, and the connection pattern 162 is exposed through the first and second auxiliary contact holes 172b and 174b.

Next, the conductive bank 200 is formed on the first and second banks 172 and 174 corresponding to the first and second auxiliary contact holes 172b and 174b. The conductive bank 200 can be formed after formation of the first and second banks 172 and 174.

The conductive bank 200 contacts the connection pattern 162 and covers and contacts side surfaces of the first and second banks 172 and 174. At this time, the conductive bank 200 is in contact with a part of the side surface of the second bank 174. Here, a top surface of the first bank 172 can be exposed through the second auxiliary contact hole 174b, and the conductive bank 200 can be in contact with the top surface of the first bank 172.

Alternatively, the conductive bank 200 can be spaced apart from the side surface of the second bank 174. In this case, the conductive bank 200 can also be spaced apart from the top surface of the first bank 172.

The conductive bank 200 is formed on at least one side of the first and second auxiliary contact holes 172b and 174b. The conductive bank 200 exposes a top surface of the connection pattern 162 exposed through the first and second auxiliary contact holes 172b and 174b.

The conductive bank 200 is formed of a conductive polymer having an electrical conductivity of $10^2$ S/cm or more or a conductive polymer doped with metal. Here, the conductive polymer or the conductive polymer doped with metal can have the electrical conductivity of $10^2$ S/cm to $10^5$ S/cm.

The conductive polymer can be selected from pyrrole, acetylene, aniline, thiophene, selenophene, tellurophene, phenylene, phenylene sulfide, phenylene vinylene, furan, or their derivatives. At this time, the conductive polymer can have a substituent of an alkyl group, a phenylene group, a naphthalene group, an ether group, an ester group, or an amide group.

In addition, the metal doped into the conductive polymer can be copper (Cu), iron (Fe), lithium (Li), silver (Ag), ytterbium (Yb), gallium (Ga), or selenium (Se).

Then, the second charge auxiliary layer 186 and the second electrode 190 are sequentially formed on the exposed connection pattern 162, the conductive bank 200, and the second bank 174.

Here, since a side surface of the conductive bank 200 has relatively a large inclination angle, the second charge auxiliary layer 186 and the second electrode 190 are disconnected on the side surface of the conductive bank 200, and portions of the second charge auxiliary layer 186 and the second electrode 190 on a top surface of the conductive bank 200 are separated from portions of the second charge auxiliary layer 186 and the second electrode 190 on the connection pattern 162. The second charge auxiliary layer 186 and the second electrode 190 are not formed on the side surface of the conductive bank 200, thereby exposing the side surface of the conductive bank 200. Therefore, the second charge auxiliary layer 186 and the second electrode 190 on the connection pattern 162 are in direct contact with the side surface of the conductive bank 200.

Accordingly, the second electrode 190 is electrically connected to the connection pattern 162 through the conductive bank 200, and as indicated by the arrow, the second electrode 190 is electrically connected to the second auxiliary electrode 146 through the conductive bank 200 and the connection pattern 162. At this time, the second electrode 190 is in direct contact with the conductive bank 200, and the conductive bank 200 is in direct contact with the connection pattern 162, so that the contact resistance between the second electrode 190 and the connection pattern 162 can be decreased.

The side surface of the conductive bank 200 has a greater inclination angle than side surfaces of the first and second banks 172 and 174. That is, the side surface of the conductive bank 200 has a first inclination angle a1 with respect to the top surface of the connection pattern 162 parallel to the substrate 100, the side surface of the first bank 172 has a second inclination angle a2 with respect to the top surface of the connection pattern 162 parallel to the substrate 100, and the side surface of the second bank 174 has a third inclination angle a3 with respect to the top surface of the connection pattern 162 parallel to the substrate 100. Here, the first inclination angle a1 is greater than the second inclination angle a2 and the third inclination angle a3. At this time, the third inclination angle a3 can be smaller than the second inclination angle a2, but the present disclosure is not limited thereto.

The first inclination angle a1 of the side surface of the conductive bank 200, beneficially, is 85 degrees to 95 degrees. If the first inclination angle a1 is smaller than 85 degrees, the second charge auxiliary layer 186 and the second electrode 190 cannot be disconnected and can be formed on the side surface of the conductive bank 200, and the second charge auxiliary layer 186 and the second electrode 190 on the top surface of the conductive bank 200 can be connected to the second charge auxiliary layer 186 and the second electrode 190 on the connection pattern 162. Therefore, the second electrode 190 on the connection pattern 162 cannot be in direct contact with the conductive bank 200. In addition, if the first angle a1 is greater than 95 degrees, the second charge auxiliary layer 186 and the second electrode 190 on the connection pattern 162 can be spaced apart from the side surface of the conductive bank 200, so that the second electrode 190 on the connection pattern 162 cannot be in direct contact with the conductive bank 200.

It is beneficial that a height of the conductive bank 200, that is, a distance from the top surface of the connection pattern 162 to the top surface of the conductive bank 200 contacting the second bank 174 is greater than a sum of thicknesses of the second charge auxiliary layer 186 and the second electrode 190. For example, the height of the conductive bank 200 can be 1 ?m to 3 ?m, but is not limited thereto.

As described above, in the electroluminescent display device 1000 according to the first aspect of the present disclosure, by forming some of the light-emitting layer 180 through the solution process, a fine metal mask can be omitted to thereby reduce the manufacturing costs, and a display device with a large size and high definition can be implemented.

In addition, the electroluminescent display device 1000 according to the first aspect of the present disclosure can be configured as the top emission type, thereby improving luminance and reducing power consumption. Here, the second electrode 190 has the relatively thin thickness in order to transmit light and its resistance increases. However, the second electrode 190 is connected to the first and second auxiliary electrodes 114 and 146 through the connection pattern 162, so that the resistance of the second electrode 190 can be decreased.

At this time, since the conductive bank 200 is in direct contact with the second electrode 190 and the connection pattern 162, the second electrode 190 is electrically connected to the connection pattern 162 through the conductive bank 200, and it is possible to increase the contact property between the second electrode 190 and the connection pattern 162.

As described above, the conductive bank 200 is formed on at least one side of the first and second auxiliary contact holes 172b and 174b, and the conductive bank 200 can have various planar structures.

FIGS. 5A to 5D are views showing various planar structures of the conductive bank of the electroluminescent display device according to the first aspect of the present disclosure and are schematic plan views enlarging the area A1 of FIG. 3.

As shown in FIGS. 5A to 5D, the connection pattern 162 is exposed through the first and second auxiliary contact holes 172b and 174b of the first and second banks 172 and 174, and the conductive bank 200 is formed on at least one side of the first and second auxiliary contact holes 172b and 174b.

Here, the first and second auxiliary contact holes 172b and 174b are shown as having a rectangular plane structure, but the present disclosure is not limited thereto. Alternatively, the first and second auxiliary contact holes 172b and 174b can have various plane structures such as a circular, oval or polygonal plane structure other than the rectangular plane structure. Otherwise, the first and second auxiliary contact holes 172b and 174b can have a polygonal plane structure with rounded corners.

In addition, the conductive bank 200 is shown as having a rectangular shape. However, the present disclosure is not limited thereto, and the conductive bank 200 can have various shapes.

Figure 5A:
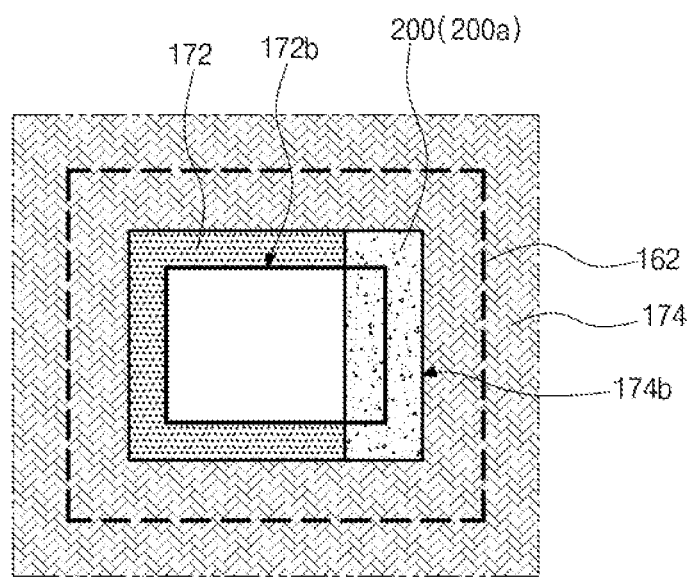
FIGS. 5A to 5D are schematic plan views enlarging area A1 of FIG. 3 showing various planar structures according to the first aspect of the present disclosure.

In FIG. 5A, the conductive bank 200a can be formed on one side of the first and second auxiliary contact holes 172b and 174b. The conductive bank 200a of FIG. 5A is shown as being formed on a right side of the first and second auxiliary contact holes 172b and 174b, but is not limited thereto. Alternatively, the conductive bank 200a can be formed on an upper side, a lower side, or a left side of the first and second auxiliary contact holes 172b and 174b. The structure of FIG. 5A is simple and easy to form, so that it can be applied to various configurations.

Figure 5B:
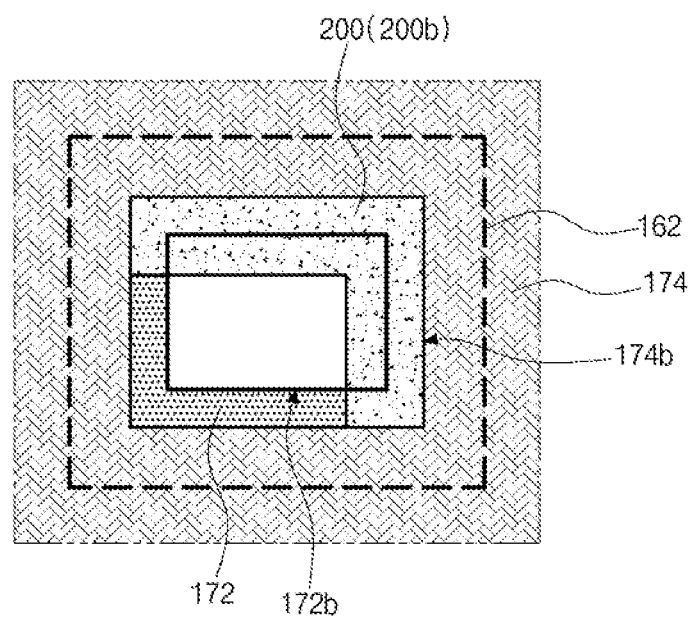

In FIG. 5B, the conductive bank 200b can be formed on two adjacent sides of the first and second auxiliary contact holes 172b and 174b. The conductive bank 200b of FIG. 5B is shown as being formed on the upper and right sides of the first and second auxiliary contact holes 172b and 174b, but is not limited thereto. Alternatively, the conductive bank 200b can be formed on the upper and left sides, the left and lower sides, or the left and right sides of the first and second auxiliary contact holes 172b and 174b. The structure of FIG. 5B increases the contact area of the conductive bank 200b with the second electrode 190 and the connection pattern 162 compared with the structure of FIG. 5A, so that it is advantageous for the ohmic contact between the second electrode 190 and the connection pattern 162.

Figure 5C:
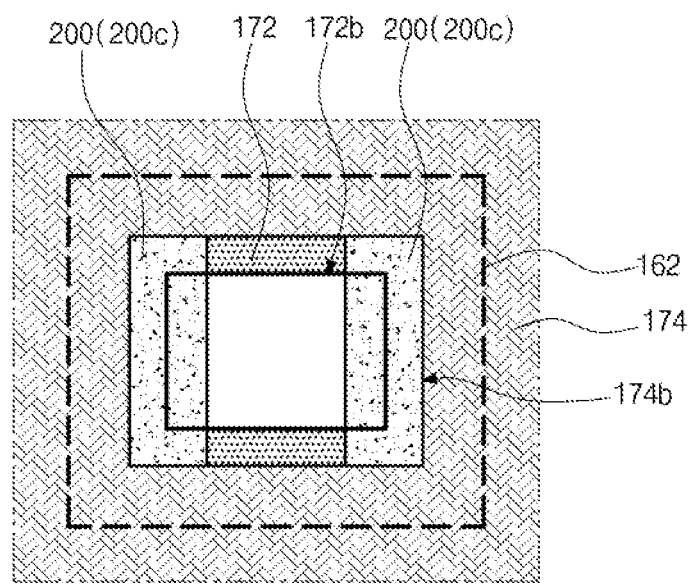

In FIG. 5C, the conductive bank 200c can be formed on two opposite sides of the first and second auxiliary contact holes 172b and 174b. The conductive bank 200c of FIG. 5C is shown as being formed on the left and right sides of the first and second auxiliary contact holes 172b and 174b, but is not limited thereto. Alternatively, the conductive bank 200c can be formed on the upper and lower sides of the first and second auxiliary contact holes 172b and 174b. Like the structure of FIG. 5B, the structure of FIG. 5C increases the contact area of the conductive bank 200c with the second electrode 190 and the connection pattern 162 compared with the structure of FIG. 5A, so that it is advantageous for the ohmic contact between the second electrode 190 and the connection pattern 162.

Figure 5D:
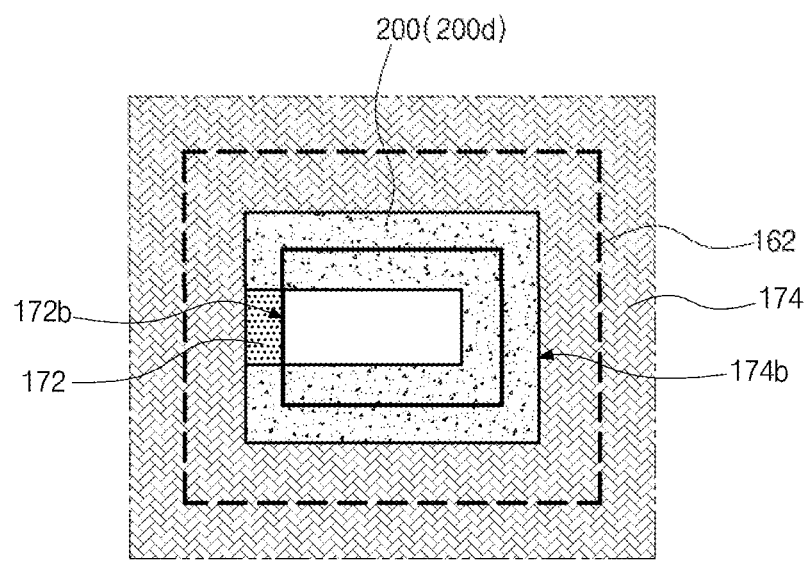

In FIG. 5D, the conductive bank 200d can be formed on three sides of the first and second auxiliary contact holes 172b and 174b. The conductive bank 200d of FIG. 5D is shown as being formed on the upper, lower and right sides of the first and second auxiliary contact holes 172b and 174b, but is not limited thereto. Alternatively, the conductive bank 200d can be formed on the upper, lower and left sides, the upper, left and right sides, or the lower, left and right sides of the first and second auxiliary contact holes 172b and 174b. The structure of FIG. 5D further increases the contact area of the conductive bank 200d with the second electrode 190 and the connection pattern 162 compared with the structures of FIGS. 5A to 5C, so that it is advantageous for the ohmic contact between the second electrode 190 and the connection pattern 162. In addition, as the resolution increases, the sizes of the first and second auxiliary contact holes 172b and 174b decrease. Since the contact area of the conductive bank 200d with the second electrode 190 and the connection pattern 162 is relatively large, the contact property between the second electrode 190 and the connection pattern 162 can be maintained at a certain level, so that it is advantageous for application to a high definition display device.

As described above, the conductive bank 200 according to the first aspect of the present disclosure is formed on at least one side of the first and second auxiliary contact holes 172b and 174b. At this time, it is beneficial that the conductive bank 200 is formed to correspond to part of the first and second auxiliary contact holes 172b and 174b.

In the first aspect of the present disclosure, the conductive bank 200 is formed after formation of the first and second banks 172 and 174. Alternatively, the conductive bank can be formed between the first and second banks 172 and 174. That is, the conductive bank can be formed after formation of the first bank 172, and then the second bank 174 can be formed. Such a second aspect of the present disclosure will be described hereinafter with reference to drawings.

—Second Aspect—

Figure 6:
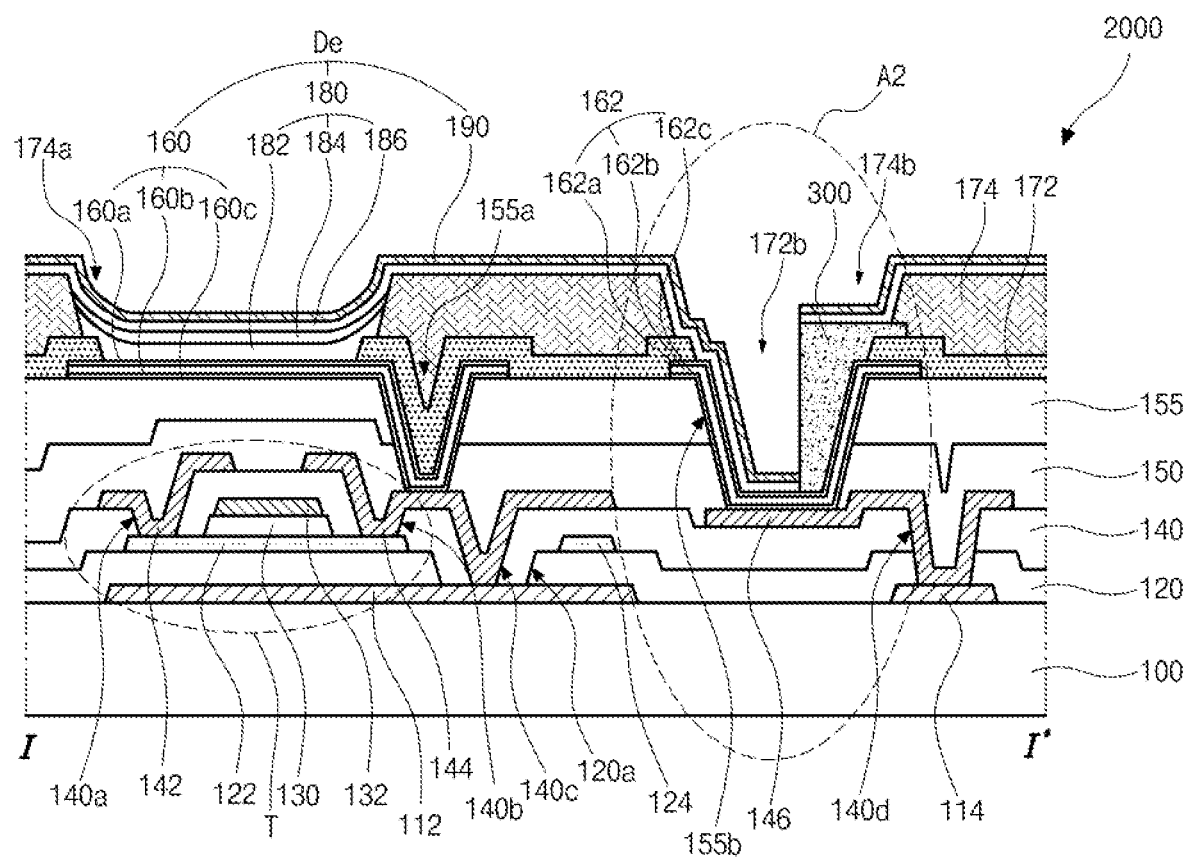
FIG. 6 is a schematic cross-sectional view of an electroluminescent display device according to a second aspect of the present disclosure corresponding to line I-I' of FIG. 2.

FIG. 6 is a schematic cross-sectional view of an electroluminescent display device according to a second aspect of the present disclosure and shows a cross-section corresponding to the line I-I' of FIG. 2. The electroluminescent display device according to the second aspect of the present disclosure has substantially the same configuration as that of the first aspect except for the conductive bank. The same parts as that of the first aspect are designated by the same reference signs, and explanation for the same parts will be shortened or omitted.

As shown in FIG. 6, in the electroluminescent display device 2000 according to the second aspect of the present disclosure, the thin film transistor T is formed on the substrate 100, and the first electrode 160, the light-emitting layer 180 and the second electrode 190 are sequentially formed over the thin film transistor T to thereby form the light-emitting diode De. Some of the light-emitting layer 180, for example, the first charge auxiliary layer 182 and the light-emitting material layer 184, can be formed through a solution process.

Here, light from the light-emitting layer 180 of the light-emitting diode De is output to the outside through the second electrode 190.

To do this, the second electrode 190 can be formed of a metal material such as aluminum (Al), magnesium (Mg), silver (Ag), or an alloy thereof and can have a relatively thin thickness such that light can be transmitted therethrough. For example, the second electrode 190 can have the thickness of 5 nm to 10 nm, but is not limited thereto. Alternatively, the second electrode 190 can be formed of a transparent conductive material such as IGO or IZO.

The second electrode 190 is electrically connected to the connection pattern 162 through the first and second auxiliary contact holes 172b and 174b of the first and second banks 172 and 174. Therefore, the second electrode 190 is electrically connected to the first and second auxiliary electrodes 114 and 146 through the connection pattern 162.

At this time, the second charge auxiliary layer 186, which is formed through a thermal evaporation process, is disposed between the second electrode 190 and the connection pattern 162. Since the second charge auxiliary layer 186 has an insulating property, a contact property between the second electrode 190 and the connection pattern 162 can be lowered. To improve the contact property between the second electrode 190 and the connection pattern 162, a conductive bank 300 is formed on at least one side surface of the first and second banks 172 and 174 corresponding to the first and second auxiliary contact holes 172b and 174b, so that the conductive bank 300 is in direct contact with the second electrode 190 and the connection pattern 162.

This will be described in more detail with reference to FIG. 7.

Figure 7:
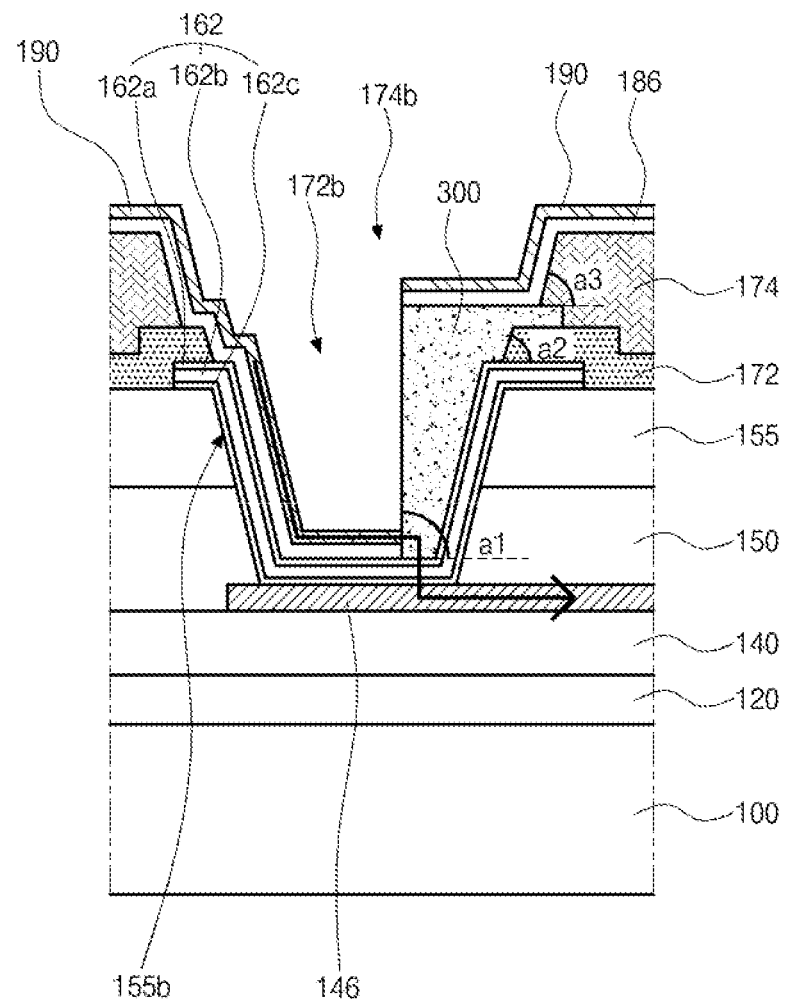
FIG. 7 is a schematic cross-sectional view enlarging area A2 of FIG. 6.

FIG. 7 is a schematic cross-sectional view enlarging the area A2 of FIG. 6 and shows a connection structure of a second electrode and an auxiliary electrode.

In FIG. 7, the connection pattern 162 is exposed through the first and second auxiliary contact holes 172b and 174b of the first and second banks 172 and 174, the second charge auxiliary layer 186 is formed between the connection pattern 162 and the second electrode 190, and the conductive bank 300 is formed between the connection pattern 162 and the second charge auxiliary layer 186.

More particularly, the first bank 172 having the first auxiliary contact hole 172b is formed on the connection pattern 162. The conductive bank 300 is formed on the first bank 172 corresponding to the first auxiliary contact hole 172b. The second bank 174 is formed on the first bank 172 and the conductive bank 300 and has the second auxiliary contact hole 174b corresponding to the first auxiliary contact hole 172b. The connection pattern 162 is exposed through the first and second auxiliary contact holes 172b and 174b.

The conductive bank 300 contacts the connection pattern 162, and one end of the conductive bank 300 is disposed between the first and second banks 172 and 174. Accordingly, the conductive bank 300 covers and contacts top and side surfaces of the first bank 172, and the second bank 174 covers and contacts top and side surfaces of the conductive bank 300.

The conductive bank 300 is formed on at least one side of the first and second auxiliary contact holes 172b and 174b. The conductive bank 300 exposes a top surface of the connection pattern 162 exposed through the first and second auxiliary contact holes 172b and 174b.

The conductive bank 300 is formed of a conductive polymer having an electrical conductivity of $10^2$ S/cm or more or a conductive polymer doped with metal. Here, the conductive polymer or the conductive polymer doped with metal can have the electrical conductivity of $10^2$ S/cm to $10^5$ S/cm.

The conductive polymer can be selected from pyrrole, acetylene, aniline, thiophene, selenophene, tellurophene, phenylene, phenylene sulfide, phenylene vinylene, furan, or their derivatives. At this time, the conductive polymer can have a substituent of an alkyl group, a phenylene group, a naphthalene group, an ether group, an ester group, or an amide group.

In addition, the metal doped into the conductive polymer can be copper (Cu), iron (Fe), lithium (Li), silver (Ag), ytterbium (Yb), gallium (Ga), or selenium (Se).

Then, the second charge auxiliary layer 186 and the second electrode 190 are sequentially formed on the exposed connection pattern 162, the conductive bank 300, and the second bank 174.

Here, since the side surface of the conductive bank 300 has relatively a large inclination angle, the second charge auxiliary layer 186 and the second electrode 190 are disconnected on the side surface of the conductive bank 300, and portions of the second charge auxiliary layer 186 and the second electrode 190 on the top surface of the conductive bank 300 are separated from portions of the second charge auxiliary layer 186 and the second electrode 190 on the connection pattern 162. The second charge auxiliary layer 186 and the second electrode 190 are not formed on the side surface of the conductive bank 300, thereby exposing the side surface of the conductive bank 300. Therefore, the second charge auxiliary layer 186 and the second electrode 190 on the connection pattern 162 are in direct contact with the side surface of the conductive bank 300.

Accordingly, the second electrode 190 is electrically connected to the connection pattern 162 through the conductive bank 300, and as indicated by the arrow, the second electrode 190 is electrically connected to the second auxiliary electrode 146 through the conductive bank 300 and the connection pattern 162. At this time, the second electrode 190 is in direct contact with the conductive bank 300, and the conductive bank 300 is in direct contact with the connection pattern 162, so that the contact resistance between the second electrode 190 and the connection pattern 162 can be decreased.

The side surface of the conductive bank 300 has a greater inclination angle than side surfaces of the first and second banks 172 and 174. That is, the side surface of the conductive bank 300 has a first inclination angle a1 with respect to the top surface of the connection pattern 162 parallel to the substrate 100, the side surface of the first bank 172 has a second inclination angle a2 with respect to the top surface of the connection pattern 162 parallel to the substrate 100, and the side surface of the second bank 174 has a third inclination angle a3 with respect to the top surface of the connection pattern 162 parallel to the substrate 100. Here, the first inclination angle a1 is greater than the second inclination angle a2 and the third inclination angle a3. At this time, the third inclination angle a3 can be smaller than the second inclination angle a2, but the present disclosure is not limited thereto.

The first inclination angle a1 of the side surface of the conductive bank 300, beneficially, is 85 degrees to 95 degrees. If the first inclination angle a1 is smaller than 85 degrees, the second charge auxiliary layer 186 and the second electrode 190 cannot be disconnected and can be formed on the side surface of the conductive bank 300, and the second charge auxiliary layer 186 and the second electrode 190 on the top surface of the conductive bank 300 can be connected to the second charge auxiliary layer 186 and the second electrode 190 on the connection pattern 162. Therefore, the second electrode 190 on the connection pattern 162 cannot be in direct contact with the conductive bank 300. In addition, if the first angle a1 is greater than 95 degrees, the second charge auxiliary layer 186 and the second electrode 190 on the connection pattern 162 can be spaced apart from the side surface of the conductive bank 300, so that the second electrode 190 on the connection pattern 162 cannot be in direct contact with the conductive bank 300.

It is beneficial that a height of the conductive bank 300, that is, a distance from the top surface of the connection pattern 162 to the top surface of the conductive bank 300 contacting the second bank 174 is greater than a sum of thicknesses of the second charge auxiliary layer 186 and the second electrode 190. For example, the height of the conductive bank 300 can be 1 ?m to 3 ?m, but is not limited thereto.

As described above, in the electroluminescent display device 2000 according to the second aspect of the present disclosure, by forming some of the light-emitting layer 180 through the solution process, a fine metal mask can be omitted to thereby reduce the manufacturing costs, and a display device with a large size and high definition can be implemented.

In addition, the electroluminescent display device 2000 according to the second aspect of the present disclosure can be configured as the top emission type, thereby improving luminance and reducing power consumption. Here, the second electrode 190 has the relatively thin thickness in order to transmit light and its resistance increases. However, the second electrode 190 is connected to the first and second auxiliary electrodes 114 and 146 through the connection pattern 162, so that the resistance of the second electrode 190 can be decreased.

At this time, since the conductive bank 300 is in direct contact with the second electrode 190 and the connection pattern 162, the second electrode 190 is electrically connected to the connection pattern 162 through the conductive bank 300, and it is possible to increase the contact property between the second electrode 190 and the connection pattern 162.

As described above, the conductive bank 300 is formed on at least one side of the first and second auxiliary contact holes 172b and 174b, and the conductive bank 300 can have various planar structures.

FIGS. 8A to 8D are views showing various planar structures of the conductive bank of the electroluminescent display device according to the second aspect of the present disclosure and are schematic plan views enlarging the area A2 of FIG. 6.

As shown in FIGS. 8A to 8D, the connection pattern 162 is exposed through the first and second auxiliary contact holes 172b and 174b of the first and second banks 172 and 174, and the conductive bank 300 is formed on at least one side of the first and second auxiliary contact holes 172b and 174b. Some edges of the conductive bank 300 are disposed between the first and second banks 172 and 174.

Here, the first and second auxiliary contact holes 172b and 174b are shown as having a rectangular plane structure, but the present disclosure is not limited thereto. Alternatively, the first and second auxiliary contact holes 172b and 174b can have various plane structures such as a circular, oval or polygonal plane structure other than the rectangular plane structure. Otherwise, the first and second auxiliary contact holes 172b and 174b can have a polygonal plane structure with rounded corners.

In addition, the conductive bank 300 is shown as having a rectangular shape. However, the present disclosure is not limited thereto, and the conductive bank 300 can have various shapes.

Figure 8A:
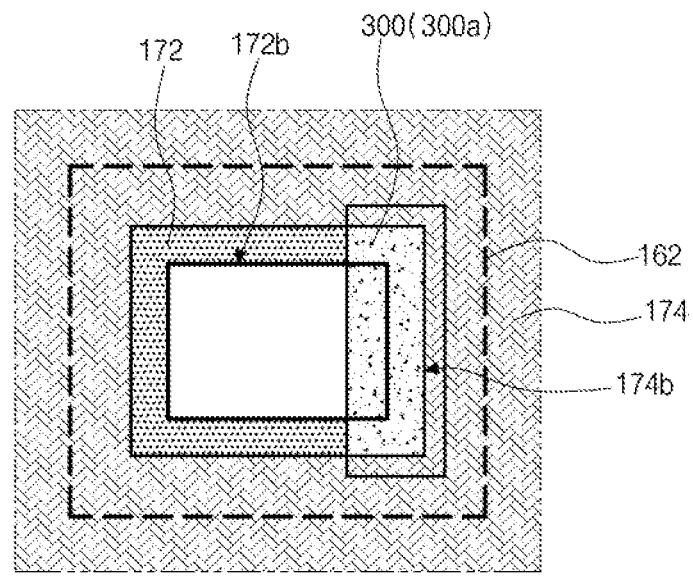
FIGS. 8A to 8D are schematic plan views enlarging area A2 of FIG. 6 showing various planar structures according to the second aspect of the present disclosure.

In FIG. 8A, the conductive bank 300a can be formed on one side of the first and second auxiliary contact holes 172b and 174b. The conductive bank 300a of FIG. 8A is shown as being formed on a right side of the first and second auxiliary contact holes 172b and 174b, but is not limited thereto. Alternatively, the conductive bank 300a can be formed on an upper side, a lower side, or a left side of the first and second auxiliary contact holes 172b and 174b. The structure of FIG. 8A is simple and easy to form, so that it can be applied to various configurations.

Figure 8B:
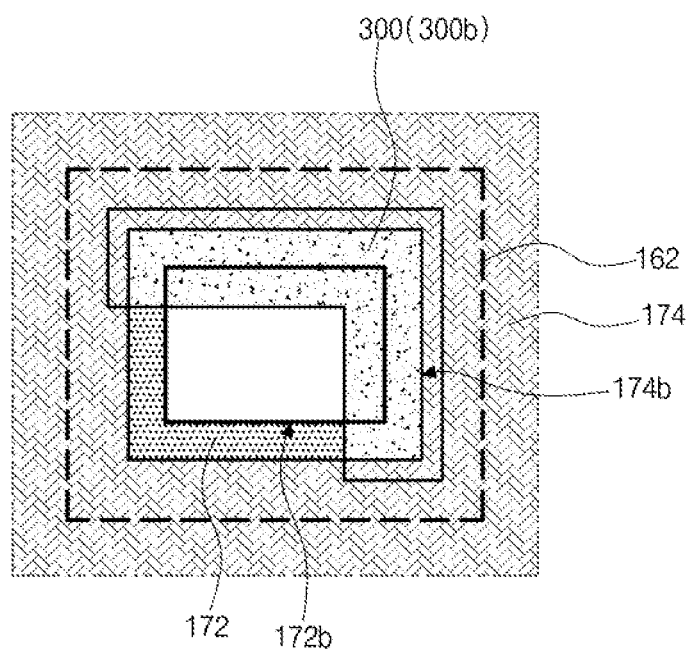

In FIG. 8B, the conductive bank 300b can be formed on two adjacent sides of the first and second auxiliary contact holes 172b and 174b. The conductive bank 300b of FIG. 8B is shown as being formed on the upper and right sides of the first and second auxiliary contact holes 172b and 174b, but is not limited thereto. Alternatively, the conductive bank 300b can be formed on the upper and left sides, the left and lower sides, or the left and right sides of the first and second auxiliary contact holes 172b and 174b. The structure of FIG. 8B increases the contact area of the conductive bank 300b with the second electrode 190 and the connection pattern 162 compared with the structure of FIG. 8A, so that it is advantageous for the ohmic contact between the second electrode 190 and the connection pattern 162.

Figure 8C:
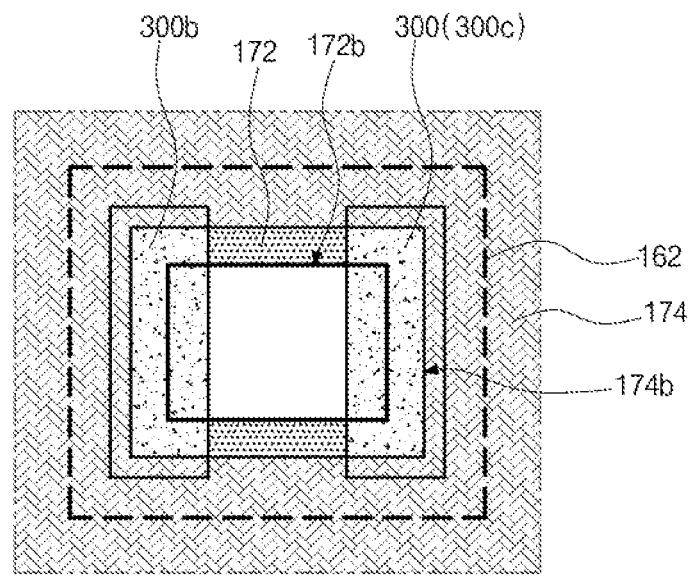

In FIG. 8C, the conductive bank 300c can be formed on two opposite sides of the first and second auxiliary contact holes 172b and 174b. The conductive bank 300c of FIG. 8C is shown as being formed on the left and right sides of the first and second auxiliary contact holes 172*b* and 174*b*, but is not limited thereto. Alternatively, the conductive bank 300*c* can be formed on the upper and lower sides of the first and second auxiliary contact holes 172*b* and 174*b*. Like the structure of FIG. 8B, the structure of FIG. 8C increases the contact area of the conductive bank 300*c* with the second electrode 190 and the connection pattern 162 compared with the structure of FIG. 8A, so that it is advantageous for the ohmic contact between the second electrode 190 and the connection pattern 162.

Figure 8D:
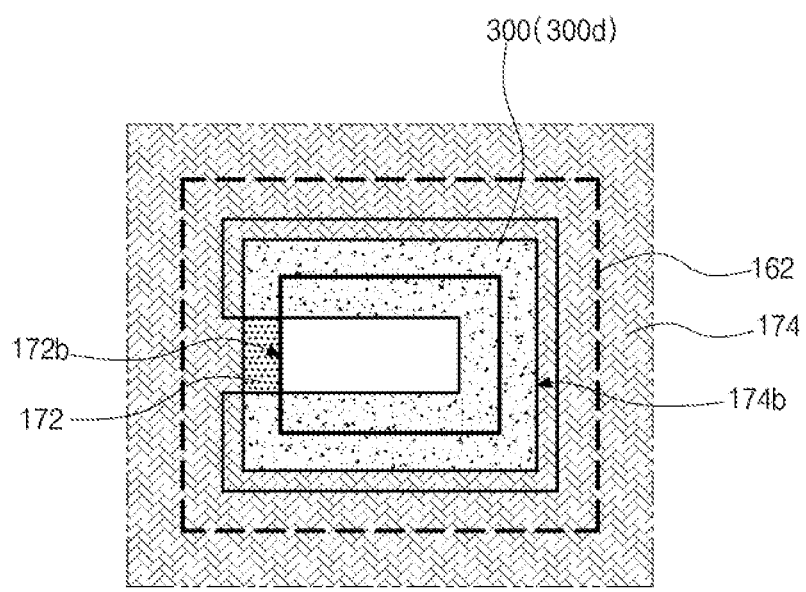

In FIG. 8D, the conductive bank 300*d* can be formed on three sides of the first and second auxiliary contact holes 172*b* and 174*b*. The conductive bank 300*d* of FIG. 8D is shown as being formed on the upper, lower and right sides of the first and second auxiliary contact holes 172*b* and 174*b*, but is not limited thereto. Alternatively, the conductive bank 300*d* can be formed on the upper, lower and left sides, the upper, left and right sides, or the lower, left and right sides of the first and second auxiliary contact holes 172*b* and 174*b*. The structure of FIG. 8D further increases the contact area of the conductive bank 300*d* with the second electrode 190 and the connection pattern 162 compared with the structures of FIGS. 8A to 8C, so that it is advantageous for the ohmic contact between the second electrode 190 and the connection pattern 162. In addition, as the resolution increases, the sizes of the first and second auxiliary contact holes 172*b* and 174*b* decrease. Since the contact area of the conductive bank 300*d* with the second electrode 190 and the connection pattern 162 is relatively large, the contact property between the second electrode 190 and the connection pattern 162 can be maintained at a certain level, so that it is advantageous for application to a high definition display device.

As described above, the conductive bank 300 according to the second aspect of the present disclosure is formed on at least one side of the first and second auxiliary contact holes 172*b* and 174*b*. At this time, it is beneficial that the conductive bank 300 is formed to correspond to part of the first and second auxiliary contact holes 172*b* and 174*b*.

In the above aspects of the present disclosure, the conductive bank is applied to a double bank structure including the first and second banks. Alternatively, the conductive bank can be applied to a single bank structure. Other aspects of the present disclosure including a single bank structure will be described hereinafter with reference to drawings.

Figure 9:
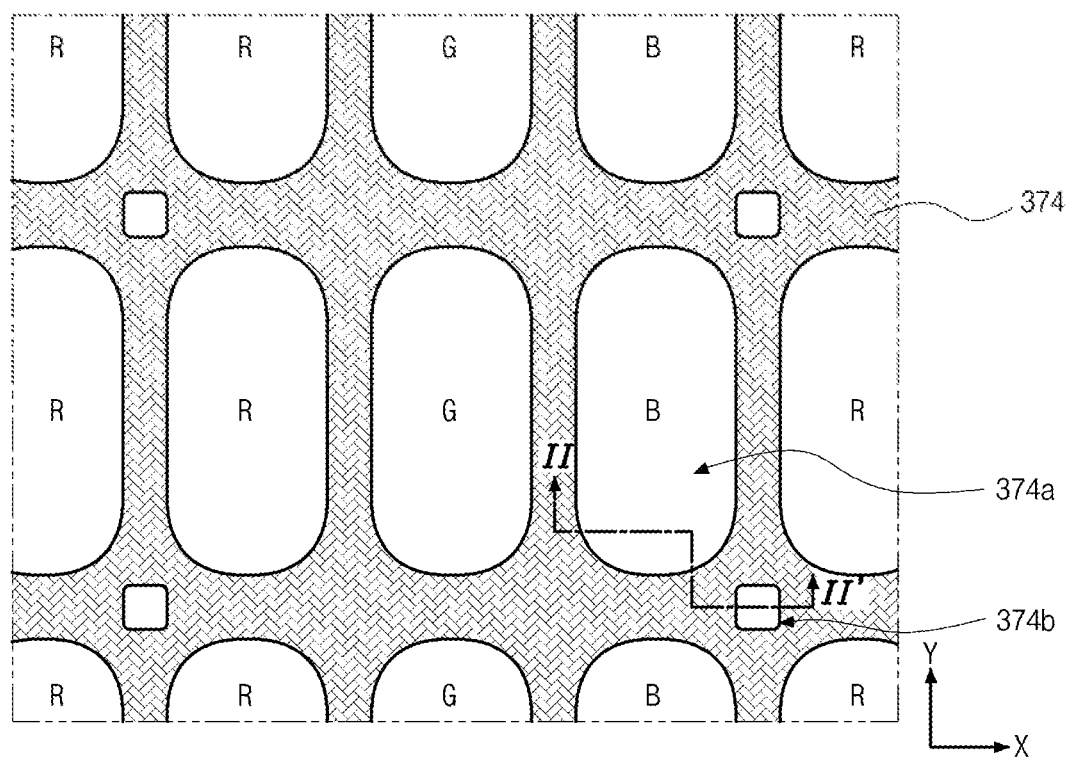
FIG. 9 is a schematic plan view of an electroluminescent display device according to another aspect of the present disclosure.

FIG. 9 is a schematic plan view of an electroluminescent display device according to another aspect of the present disclosure and mainly shows a bank configuration.

As shown in FIG. 9, one pixel of the electroluminescent display device according to another aspect of the present disclosure includes red, green, and blue sub-pixels R, G, and B. Each of the red, green, and blue sub-pixels R, G, and B can have the circuit configuration of the pixel region P of FIG. 1.

The red, green, and blue sub-pixels R, G, and B are sequentially arranged along a first direction (X direction), which is a horizontal direction in the context of the figure, and the same color sub-pixels R, G, and B are arranged along a second direction (Y direction), which is perpendicular to the first direction (X direction). However, the present disclosure is not limited thereto. Alternatively, the different color sub-pixels R, G, and B can be arranged along the second direction (Y direction), and the same color sub-pixels R, G, and B can be arranged along a third reaction crossing the first and second directions (X and Y directions).

Here, the red, green, and blue sub-pixels R, G, and B are shown to each have a rectangular shape with rounded corners, but is not limited thereto. Each of the red, green, and blue sub-pixels R, G, and B can have various shapes such as a rectangular shape with angled corners, an oval shape, or the like.

The red, green, and blue sub-pixels R, G, and B can have the same size. However, the present disclosure is not limited thereto. Alternatively, the red, green, and blue sub-pixels R, G, and B can have different sizes considering the lifetime of a light-emitting diode provided at each sub-pixel. For example, the size of the green sub-pixel G can be larger than the size of the red sub-pixel R and smaller than the size of the blue sub-pixel B.

The red, green, and blue sub-pixels R, G, and B can be defined by a bank 374. The bank 374 can be a hydrophobic bank.

The hydrophobic bank 374 can be formed of an organic insulating material having a hydrophobic property. Alternatively, the hydrophobic bank 374 can be formed of an organic insulating material having a hydrophilic property and subjected to a hydrophobic treatment.

Here, at least a top surface of the hydrophobic bank 374 is hydrophobic, and a side surface of the hydrophobic bank 374 can be hydrophobic or hydrophilic.

The hydrophobic bank 374 is disposed between adjacent different color sub-pixels R, G, and B along the first direction (X direction) and between adjacent same color sub-pixels R, G, and B along the second direction (Y direction) and surrounds each of the sub-pixels R, G, and B. According to this, the hydrophobic bank 374 has an opening 374*a* corresponding to each sub-pixel R, G, and B.

In addition, the hydrophobic bank 374 has an auxiliary contact hole 374*b*. One auxiliary contact hole 374*b* can be formed to correspond to one pixel. However, the present disclosure is not limited thereto, and the number of auxiliary contact holes 374*b* can be varied. For example, the auxiliary contact hole 374*b* can be disposed between the adjacent blue and red sub-pixels B and R along the third direction crossing the first and second directions (X and Y directions) and between the adjacent blue and red sub-pixels B and R along a fourth direction crossing the first and second directions (X and Y directions). Accordingly, the auxiliary contact hole 374*b* can be surrounded by two blue sub-pixels B and two red sub-pixels R. However, the present disclosure is not limited thereto, and the location of the auxiliary contact hole 374*b* can be changed.

Although not shown in the figure, an auxiliary electrode and a connection pattern are formed to correspond to the auxiliary contact hole 374*b*, and the connection pattern is exposed through the auxiliary contact hole 374*b*. In addition, a conductive bank is formed between the connection pattern and the second electrode. Accordingly, the second electrode of the light-emitting diode is electrically connected to the auxiliary electrode through the connection pattern, and it is possible to decrease the contact resistance between the connection pattern and the second electrode due to the conductive bank.

Specific configurations of the electroluminescent display device according to the aspect of the present disclosure will be described in detail with reference to drawings.

—Third Aspect—

Figure 10:
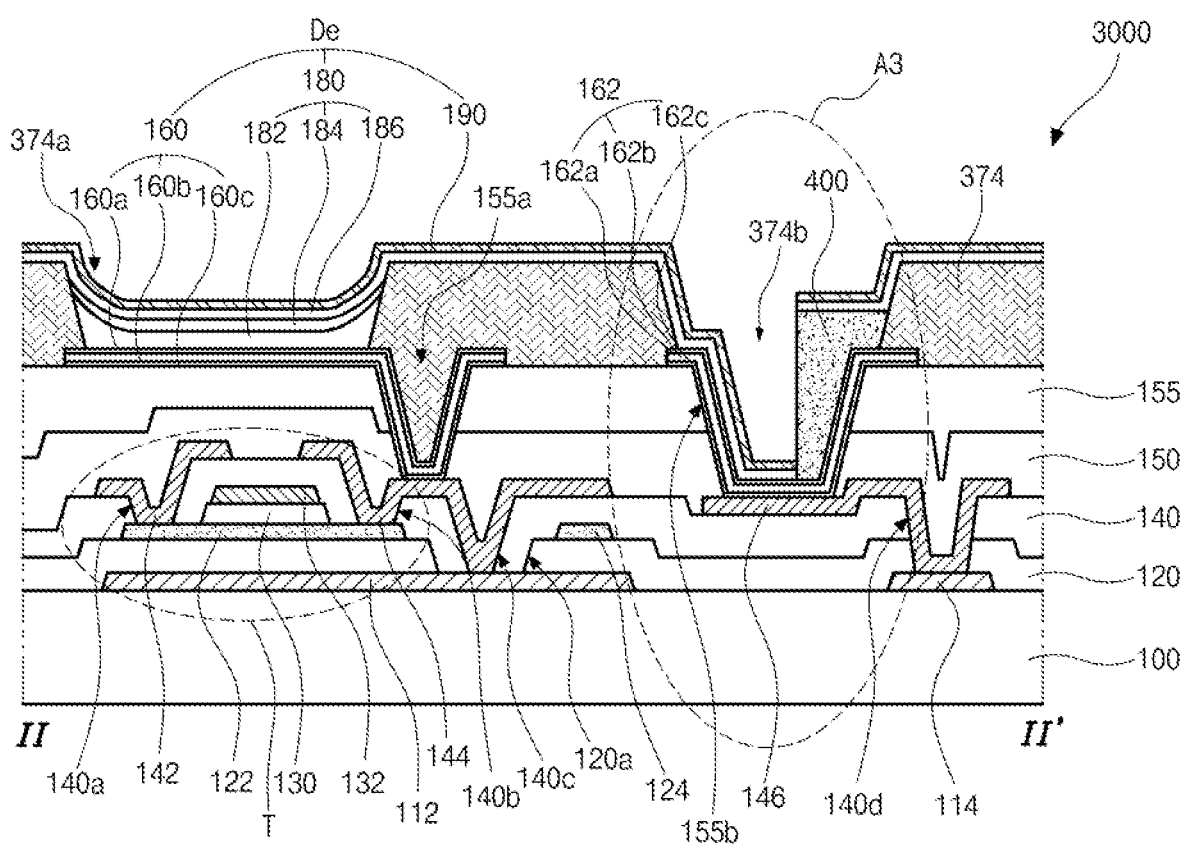
FIG. 10 is a schematic cross-sectional view of an electroluminescent display device according to a third aspect of the present disclosure.

FIG. 10 is a schematic cross-sectional view of an electroluminescent display device according to a third aspect of the present disclosure and shows a cross-section corresponding to the line II-II' of FIG. 9. The electroluminescent display device according to the third aspect of the present disclosure has substantially the same configuration as that of the first aspect except for the bank of the single structure and the conductive bank. The same parts as that of the first aspect are designated by the same reference signs, and explanation for the same parts will be shortened or omitted.

As shown in FIG. 10, in the electroluminescent display device 3000 according to the third aspect of the present disclosure, the thin film transistor T is formed on the substrate 100, and the first electrode 160, the light-emitting layer 180 and the second electrode 190 are sequentially formed over the thin film transistor T to thereby form the light-emitting diode De. Some of the light-emitting layer 180, for example, the first charge auxiliary layer 182 and the light-emitting material layer 184, can be formed through a solution process.

Here, light from the light-emitting layer 180 of the light-emitting diode De is output to the outside through the second electrode 190.

To do this, the second electrode 190 can be formed of a metal material such as aluminum (Al), magnesium (Mg), silver (Ag), or an alloy thereof and can have a relatively thin thickness such that light can be transmitted therethrough. For example, the second electrode 190 can have the thickness of 5 nm to 10 nm, but is not limited thereto. Alternatively, the second electrode 190 can be formed of a transparent conductive material such as IGO or IZO.

The second electrode 190 is electrically connected to the connection pattern 162 through the auxiliary contact hole 374b of the hydrophobic bank 374. Therefore, the second electrode 190 is electrically connected to the first and second auxiliary electrodes 114 and 146 through the connection pattern 162.

At this time, the second charge auxiliary layer 186, which is formed through a thermal evaporation process, is disposed between the second electrode 190 and the connection pattern 162. Since the second charge auxiliary layer 186 has an insulating property, a contact property between the second electrode 190 and the connection pattern 162 can be lowered. To improve the contact property between the second electrode 190 and the connection pattern 162, a conductive bank 400 is formed on at least one side surface of the hydrophobic bank 374 corresponding to the auxiliary contact hole 374b, so that the conductive bank 400 is in direct contact with the second electrode 190 and the connection pattern 162.

This will be described in more detail with reference to FIG. 11.

Figure 11:
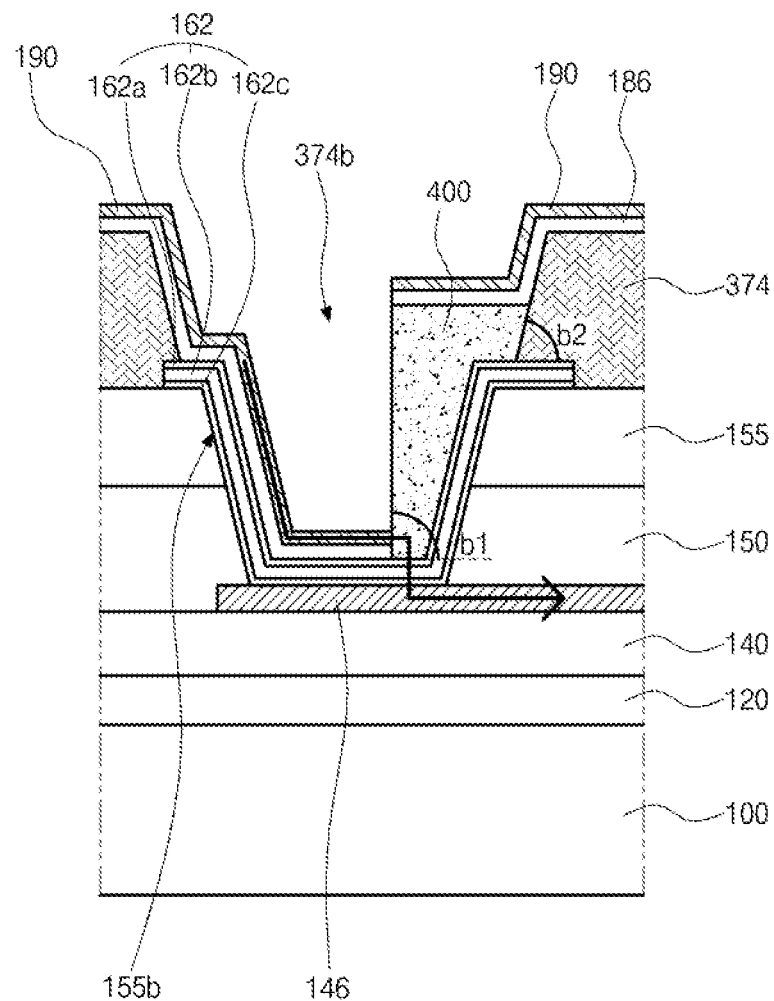
FIG. 11 is a schematic cross-sectional view enlarging area A3 of FIG. 10.

FIG. 11 is a schematic cross-sectional view enlarging the area A3 of FIG. 10 and shows a connection structure of a second electrode and an auxiliary electrode.

In FIG. 11, the connection pattern 162 is exposed through the auxiliary contact hole 374b of the hydrophobic bank 374, the second charge auxiliary layer 186 is formed between the connection pattern 162 and the second electrode 190, and the conductive bank 400 is formed between the connection pattern 162 and the second charge auxiliary layer 186.

More particularly, the hydrophobic bank 374 having the auxiliary contact hole 374b is formed on the connection pattern 162. The connection pattern 162 is exposed through the auxiliary contact hole 374b.

Next, the conductive bank 400 is formed on the hydrophobic bank 374 corresponding to the auxiliary contact hole 374b. The conductive bank 400 can be formed after formation of the hydrophobic bank 374.

The conductive bank 400 contacts the connection pattern 162 and covers and contacts a side surface of the hydrophobic bank 374. At this time, the conductive bank 400 is in contact with a part of the side surface of the hydrophobic bank 374.

The conductive bank 400 is formed on at least one side of the auxiliary contact hole 374b. The conductive bank 400 exposes a top surface of the connection pattern 162 exposed through the auxiliary contact hole 374b.

The conductive bank 400 is formed of a conductive polymer having an electrical conductivity of $10^2$ S/cm or more or a conductive polymer doped with metal. Here, the conductive polymer or the conductive polymer doped with metal can have the electrical conductivity of $10^2$ S/cm to $10^5$ S/cm.

The conductive polymer can be selected from pyrrole, acetylene, aniline, thiophene, selenophene, tellurophene, phenylene, phenylene sulfide, phenylene vinylene, furan, or their derivatives. At this time, the conductive polymer can have a substituent of an alkyl group, a phenylene group, a naphthalene group, an ether group, an ester group, or an amide group.

In addition, the metal doped into the conductive polymer can be copper (Cu), iron (Fe), lithium (Li), silver (Ag), ytterbium (Yb), gallium (Ga), or selenium (Se).

Then, the second charge auxiliary layer 186 and the second electrode 190 are sequentially formed on the exposed connection pattern 162, the conductive bank 400, and the hydrophobic bank 374.

Here, since the side surface of the conductive bank 400 has relatively a large inclination angle, the second charge auxiliary layer 186 and the second electrode 190 are disconnected on the side surface of the conductive bank 400, and portions of the second charge auxiliary layer 186 and the second electrode 190 on the top surface of the conductive bank 400 are separated from portions of the second charge auxiliary layer 186 and the second electrode 190 on the connection pattern 162. The second charge auxiliary layer 186 and the second electrode 190 are not formed on the side surface of the conductive bank 400, thereby exposing the side surface of the conductive bank 400. Therefore, the second charge auxiliary layer 186 and the second electrode 190 on the connection pattern 162 are in direct contact with the side surface of the conductive bank 400.

Accordingly, the second electrode 190 is electrically connected to the connection pattern 162 through the conductive bank 400, and as indicated by the arrow, the second electrode 190 is electrically connected to the second auxiliary electrode 146 through the conductive bank 400 and the connection pattern 162. At this time, the second electrode 190 is in direct contact with the conductive bank 400, and the conductive bank 400 is in direct contact with the connection pattern 162, so that the contact resistance between the second electrode 190 and the connection pattern 162 can be decreased.

The side surface of the conductive bank 400 has a greater inclination angle than a side surface of the hydrophobic bank 374. That is, the side surface of the conductive bank 400 has a first inclination angle b1 with respect to the top surface of the connection pattern 162 parallel to the substrate 100, and the side surface of the hydrophobic bank 374 has a second inclination angle b2 with respect to the top surface of the connection pattern 162 parallel to the substrate 100. Here, the first inclination angle b1 is greater than the second inclination angle b2.

The first inclination angle b1 of the side surface of the conductive bank 400, beneficially, is 85 degrees to 95 degrees. If the first inclination angle b1 is smaller than 85 degrees, the second charge auxiliary layer 186 and the second electrode 190 cannot be disconnected and can be formed on the side surface of the conductive bank 400, and the second charge auxiliary layer 186 and the second electrode 190 on the top surface of the conductive bank 400 can be connected to the second charge auxiliary layer 186 and the second electrode 190 on the connection pattern 162. Therefore, the second electrode 190 on the connection pattern 162 cannot be in direct contact with the conductive bank 400. In addition, if the first angle b1 is greater than 95 degrees, the second charge auxiliary layer 186 and the second electrode 190 on the connection pattern 162 can be spaced apart from the side surface of the conductive bank 400, so that the second electrode 190 on the connection pattern 162 cannot be in direct contact with the conductive bank 400.

It is beneficial that a height of the conductive bank 400, that is, a distance from the top surface of the connection pattern 162 to the top surface of the conductive bank 400 contacting the hydrophobic bank 374 is greater than a sum of thicknesses of the second charge auxiliary layer 186 and the second electrode 190. For example, the height of the conductive bank 400 can be 1 ?m to 3 ?m, but is not limited thereto.

As described above, the conductive bank 400 is formed on at least one side of the auxiliary contact hole 374b, and the conductive bank 400 can have various planar structures. The conductive bank 400 can have substantially the same planar structure as the conductive bank 200 of the electroluminescent display device according to the first aspect shown in FIGS. 5A to 5D. At this time, the conductive bank 400 may be formed to correspond to a part of the auxiliary contact hole 374b.

In the third aspect of the present disclosure, the conductive bank 400 is formed after formation of the hydrophobic bank 374. Alternatively, the conductive bank can be formed before formation of the hydrophobic bank 374. That is, after forming the conductive bank, the hydrophobic bank 374 can be formed. Such a fourth aspect of the present disclosure will be described hereinafter with reference to drawings.

—Fourth Aspect—

Figure 12:
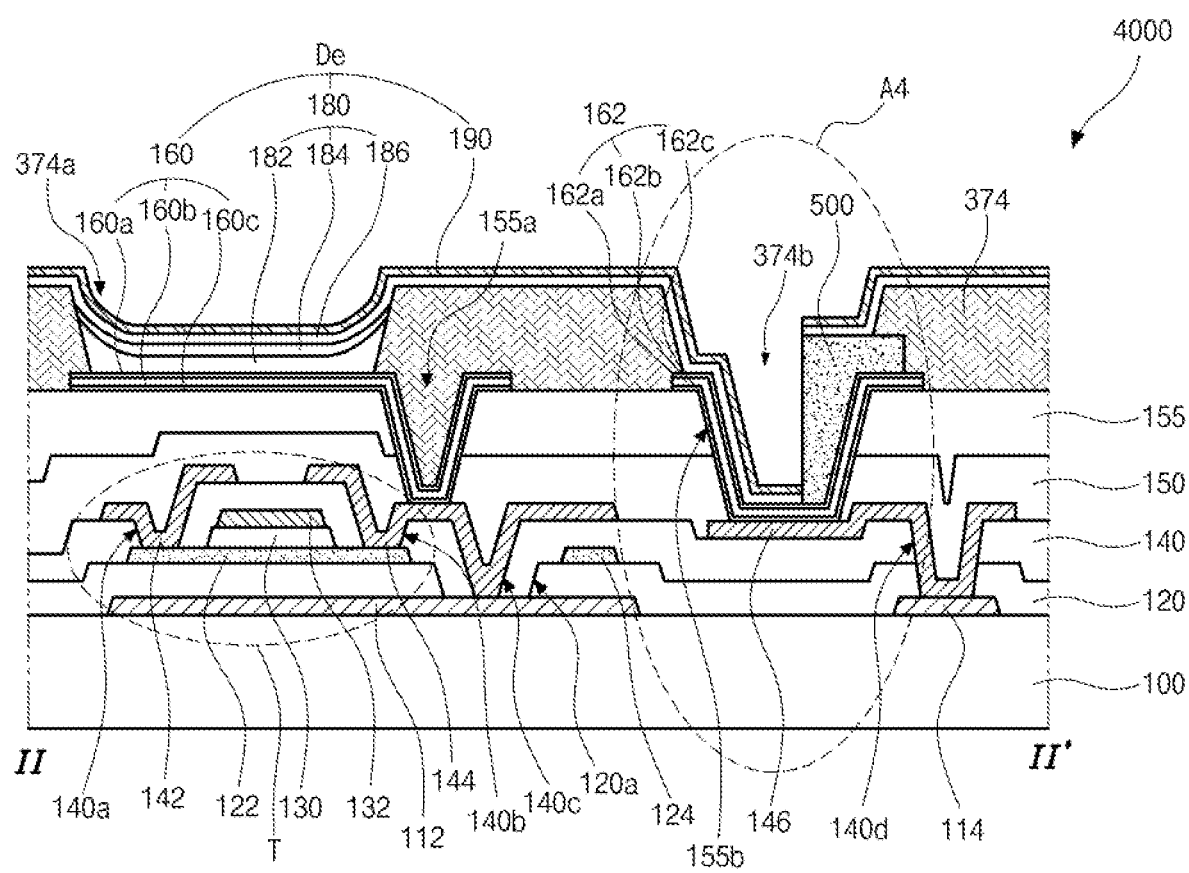
FIG. 12 is a schematic cross-sectional view of an electroluminescent display device according to a fourth aspect of the present disclosure.

FIG. 12 is a schematic cross-sectional view of an electroluminescent display device according to a fourth aspect of the present disclosure and shows a cross-section corresponding to the line II-II' of FIG. 9. The electroluminescent display device according to the fourth aspect of the present disclosure has substantially the same configuration as that of the first aspect except for the bank of the single structure and the conductive bank. The same parts as that of the first aspect are designated by the same reference signs, and explanation for the same parts will be shortened or omitted.

As shown in FIG. 12, in the electroluminescent display device 4000 according to the fourth aspect of the present disclosure, the thin film transistor T is formed on the substrate 100, and the first electrode 160, the light-emitting layer 180 and the second electrode 190 are sequentially formed over the thin film transistor T to thereby form the light-emitting diode De. Some of the light-emitting layer 180, for example, the first charge auxiliary layer 182 and the light-emitting material layer 184, can be formed through a solution process.

Here, light from the light-emitting layer 180 of the light-emitting diode De is output to the outside through the second electrode 190.

To do this, the second electrode 190 can be formed of a metal material such as aluminum (Al), magnesium (Mg), silver (Ag), or an alloy thereof and can have a relatively thin thickness such that light can be transmitted therethrough. For example, the second electrode 190 can have the thickness of 5 nm to 10 nm, but is not limited thereto. Alternatively, the second electrode 190 can be formed of a transparent conductive material such as IGO or IZO.

The second electrode 190 is electrically connected to the connection pattern 162 through the auxiliary contact hole 374b of the hydrophobic bank 374. Therefore, the second electrode 190 is electrically connected to the first and second auxiliary electrodes 114 and 146 through the connection pattern 162.

At this time, the second charge auxiliary layer 186, which is formed through a thermal evaporation process, is disposed between the second electrode 190 and the connection pattern 162. Since the second charge auxiliary layer 186 has an insulating property, a contact property between the second electrode 190 and the connection pattern 162 can be lowered. To improve the contact property between the second electrode 190 and the connection pattern 162, a conductive bank 500 is formed on at least one side surface of the hydrophobic bank 374 corresponding to the auxiliary contact hole 374b, so that the conductive bank 500 is in direct contact with the second electrode 190 and the connection pattern 162.

This will be described in more detail with reference to FIG. 13.

Figure 13:
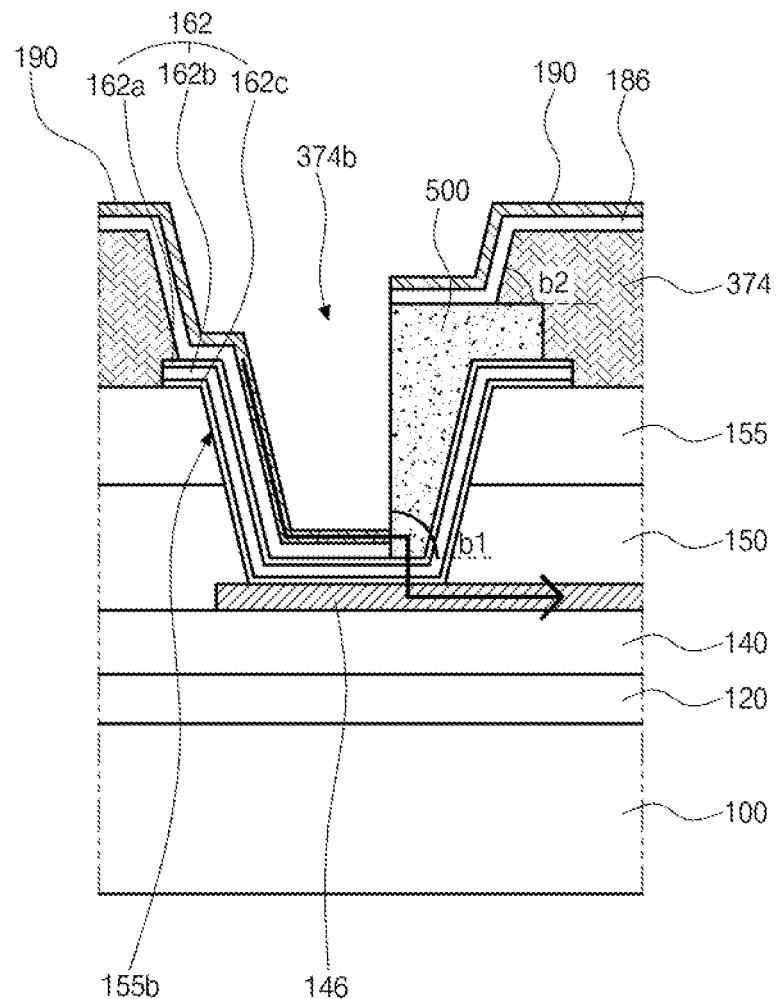
FIG. 13 is a schematic cross-sectional view enlarging area A4 of FIG. 12.

FIG. 13 is a schematic cross-sectional view enlarging the area A4 of FIG. 12 and shows a connection structure of a second electrode and an auxiliary electrode.

In FIG. 13, the connection pattern 162 is exposed through the auxiliary contact hole 374b of the hydrophobic bank 374, the second charge auxiliary layer 186 is formed between the connection pattern 162 and the second electrode 190, and the conductive bank 500 is formed between the connection pattern 162 and the second charge auxiliary layer 186.

More particularly, the conductive bank 500 is formed on the connection pattern 162. The conductive bank 500 exposes a part of the connection pattern 162.

Next, the hydrophobic bank 374 is formed on the connection pattern 162 and the conductive bank 500. The hydrophobic bank 374 covers edges of the connection pattern 162 and conductive bank 500. The hydrophobic bank 374 has the auxiliary contact hole 374b, and the connection pattern 162 and the conductive bank 500 are exposed through the auxiliary contact hole 374b.

The conductive bank 500 contacts the connection pattern 162, and one end of the conductive bank 500 is disposed between the connection pattern 162 and the hydrophobic bank 374. Accordingly, the hydrophobic bank 374 covers and contacts top and side surfaces of the conductive bank 500.

The conductive bank 500 is formed on at least one side of the auxiliary contact hole 374b.

The conductive bank 500 is formed of a conductive polymer having an electrical conductivity of $10^2$ S/cm or more or a conductive polymer doped with metal. Here, the conductive polymer or the conductive polymer doped with metal can have the electrical conductivity of $10^2$ S/cm to $10^5$ S/cm.

The conductive polymer can be selected from pyrrole, acetylene, aniline, thiophene, selenophene, tellurophene, phenylene, phenylene sulfide, phenylene vinylene, furan, or their derivatives. At this time, the conductive polymer can have a substituent of an alkyl group, a phenylene group, a naphthalene group, an ether group, an ester group, or an amide group.

In addition, the metal doped into the conductive polymer can be copper (Cu), iron (Fe), lithium (Li), silver (Ag), ytterbium (Yb), gallium (Ga), or selenium (Se).

Then, the second charge auxiliary layer 186 and the second electrode 190 are sequentially formed on the exposed connection pattern 162, the conductive bank 500, and the hydrophobic bank 374.

Here, since the side surface of the conductive bank 500 has relatively a large inclination angle, the second charge auxiliary layer 186 and the second electrode 190 are disconnected on the side surface of the conductive bank 500, and portions of the second charge auxiliary layer 186 and the second electrode 190 on the top surface of the conductive bank 500 are separated from portions of the second charge auxiliary layer 186 and the second electrode 190 on the connection pattern 162. The second charge auxiliary layer 186 and the second electrode 190 are not formed on the side surface of the conductive bank 500, thereby exposing the side surface of the conductive bank 500. Therefore, the second charge auxiliary layer 186 and the second electrode 190 on the connection pattern 162 are in direct contact with the side surface of the conductive bank 500.

Accordingly, the second electrode 190 is electrically connected to the connection pattern 162 through the conductive bank 500, and as indicated by the arrow, the second electrode 190 is electrically connected to the second auxiliary electrode 146 through the conductive bank 500 and the connection pattern 162. At this time, the second electrode 190 is in direct contact with the conductive bank 500, and the conductive bank 500 is in direct contact with the connection pattern 162, so that the contact resistance between the second electrode 190 and the connection pattern 162 can be decreased.

The side surface of the conductive bank 500 has a greater inclination angle than a side surface of the hydrophobic bank 374. That is, the side surface of the conductive bank 500 has a first inclination angle b1 with respect to the top surface of the connection pattern 162 parallel to the substrate 100, and the side surface of the hydrophobic bank 374 has a second inclination angle b2 with respect to the top surface of the connection pattern 162 parallel to the substrate 100. Here, the first inclination angle b1 is greater than the second inclination angle b2.

The first inclination angle b1 of the side surface of the conductive bank 500, beneficially, is 85 degrees to 95 degrees. If the first inclination angle b1 is smaller than 85 degrees, the second charge auxiliary layer 186 and the second electrode 190 cannot be disconnected and can be formed on the side surface of the conductive bank 500, and the second charge auxiliary layer 186 and the second electrode 190 on the top surface of the conductive bank 500 can be connected to the second charge auxiliary layer 186 and the second electrode 190 on the connection pattern 162. Therefore, the second electrode 190 on the connection pattern 162 cannot be in direct contact with the conductive bank 500. In addition, if the first angle b1 is greater than 95 degrees, the second charge auxiliary layer 186 and the second electrode 190 on the connection pattern 162 can be spaced apart from the side surface of the conductive bank 500, so that the second electrode 190 on the connection pattern 162 cannot be in direct contact with the conductive bank 500.

It is beneficial that a height of the conductive bank 500, that is, a distance from the top surface of the connection pattern 162 to the top surface of the conductive bank 500 contacting the hydrophobic bank 374 is greater than a sum of thicknesses of the second charge auxiliary layer 186 and the second electrode 190. For example, the height of the conductive bank 500 can be 1 ?m to 3 ?m, but is not limited thereto.

As described above, the conductive bank 500 is formed on at least one side of the auxiliary contact hole 374b, and the conductive bank 500 can have various planar structures. The conductive bank 500 can have substantially the same planar structure as the conductive bank 300 of the electroluminescent display device according to the second aspect shown in FIGS. 8A to 8D. At this time, the conductive bank 500 may be formed to correspond to a part of the auxiliary contact hole 374b.

In the present disclosure, by forming the light-emitting layer of each sub-pixel through the solution process, a mask is omitted to thereby reduce the manufacturing costs, and a display device with a large size and high definition can be implemented.

In addition, the light-emitting layers in pixel regions adjacent along one direction, for example, the light-emitting layers of the same color sub-pixels are connected to each other and formed as one body, thereby reducing or minimizing the deviation in the dropping amount between nozzles and uniformly forming the thicknesses of the light-emitting layers of the sub-pixels. Therefore, the mura is prevented, thereby effectively preventing the image quality of the display device from being lowered.

Moreover, the second electrode is connected to the auxiliary electrode through the connection pattern, thereby lowering the resistance of the second electrode, and the conductive bank is formed between the second electrode and the connection pattern, thereby improving the electrical contact property between the second electrode and the connection pattern.

It will be apparent to those skilled in the art that various modifications and variations can be made in a device of the present disclosure without departing from the sprit or scope of the aspect. Thus, it is intended that the present disclosure covers the modifications and variations of this disclosure provided they come within the scope of the appended claims and their equivalents.

What is claimed is:

1. An electroluminescent display device comprising:
a substrate;
a first electrode disposed on the substrate;
a connection pattern disposed on the substrate and formed of a same material as the first electrode;
a bank covering edges of the first electrode and the connection pattern and including a hydrophobic bank;
a light-emitting layer disposed on the first electrode;
a second electrode disposed on the light-emitting layer, the bank, and the connection pattern; and
a conductive bank disposed between the second electrode and the connection pattern,
wherein the second electrode is in contact with a side surface of the conductive bank.

2. The electroluminescent display device of claim 1, wherein the side surface of the conductive bank has a greater inclination angle than a side surface of the bank.

3. The electroluminescent display device of claim 2, wherein the inclination angle of the side surface of the conductive bank is in a range between 85 and 95 degrees.

4. The electroluminescent display device of claim 1, wherein the second electrode is disconnected on the side surface of the conductive bank.

5. The electroluminescent display device of claim 1, wherein the bank has an auxiliary contact hole exposing the connection pattern, and the conductive bank is formed to correspond to a part of the auxiliary contact hole.

6. The electroluminescent display device of claim 1, wherein the conductive bank is in contact with a side surface of the bank.

7. The electroluminescent display device of claim 1, wherein the conductive bank is formed of a conductive polymer having an electrical conductivity of $10^2$S/cm to $10^5$S/cm or a conductive polymer doped with metal.

8. The electroluminescent display device of claim 1, wherein the light-emitting layer includes a hole auxiliary layer, a light-emitting material layer, and an electron auxiliary layer,
wherein at least one side surface of each of the hole auxiliary layer and the light-emitting material layer is enclosed by the bank, and
wherein a part of the electron auxiliary layer is disposed between the bank and the second electrode and is in contact with the side surface of the conductive bank.

9. The electroluminescent display device of claim 1, further comprising at least one thin film transistor between the substrate and the first electrode,
wherein the first electrode is connected to the at least one thin film transistor.

10. The electroluminescent display device of claim 1, wherein the bank includes a first bank of a hydrophilic property and a second bank of a hydrophobic property.

11. The electroluminescent display device of claim 10, wherein a part of the conductive bank is disposed between the first bank and the second bank.

12. The electroluminescent display device of claim 10, wherein the first bank and the second bank are formed as one body.

13. The electroluminescent display device of claim 10, wherein light-emitting layers in pixel regions adjacent along one direction are connected to each other to form one body.

14. The electroluminescent display device of claim 1, wherein the conductive bank is disposed between the bank and the connection pattern.

15. An electroluminescent display device comprising:
a substrate;
a first electrode disposed on the substrate;
a connection pattern disposed on the substrate and formed of a same material as the first electrode;
a bank covering edges of the first electrode and the connection pattern, the bank including a hydrophilic part and a hydrophobic part;
a light-emitting layer disposed on the first electrode;
a second electrode disposed on the light-emitting layer, the bank, and the connection pattern; and
a conductive bank disposed between the second electrode and the connection pattern and a part of the conductive bank is disposed between the hydrophilic part and the hydrophobic part,
wherein the second electrode is in contact with a side surface of the conductive bank.

16. The electroluminescent display device of claim 15, wherein the side surface of the conductive bank has a greater inclination angle than a side surface of the bank.

17. The electroluminescent display device of claim 16, wherein the inclination angle of the side surface of the conductive bank is in a range between 85 and 95 degrees.

18. The electroluminescent display device of claim 15, wherein the second electrode is disconnected on the side surface of the conductive bank.

19. The electroluminescent display device of claim 15, wherein the bank has an auxiliary contact hole exposing the connection pattern, and the conductive bank is formed to correspond to a part of the auxiliary contact hole.

20. The electroluminescent display device of claim 15, wherein the conductive bank is in contact with a side surface of the bank.

* * * * *